United States Patent
Grupa et al.

(10) Patent No.: US 7,459,900 B2
(45) Date of Patent: Dec. 2, 2008

(54) MODULAR CURRENT SENSOR FOR MODULARIZED SERVO CONTROL SYSTEM

(75) Inventors: Timothy M. Grupa, Golden Valley, MN (US); Lane L. Woodland, Excelsior, MN (US); Stephen M. Stocker, Andover, MN (US); Martin J. Sukup, St. Paul, MN (US); Bret C. Bartness, Plymouth, MN (US); David J. Badzinski, Minneapolis, MN (US); Jeffrey W. Shoemaker, Andover, MN (US); Keith A. Walters, Minneapolis, MN (US)

(73) Assignee: BAE Systems Land & Armaments L.P., Arlington, VA (US)

( * ) Notice: Subject to any disclaimer, the term of this patent is extended or adjusted under 35 U.S.C. 154(b) by 0 days.

(21) Appl. No.: 11/702,445

(22) Filed: Feb. 5, 2007

(65) Prior Publication Data

US 2007/0273359 A1 Nov. 29, 2007

Related U.S. Application Data

(60) Provisional application No. 60/764,868, filed on Feb. 3, 2006.

(51) Int. Cl.
*G01R 15/20* (2006.01)
*G01R 15/18* (2006.01)
*G01R 1/38* (2006.01)

(52) U.S. Cl. .............................. 324/117 H; 324/117 R; 324/115

(58) Field of Classification Search ............. 327/117 R, 327/117 H; 318/560, 580, 599, 625
See application file for complete search history.

(56) References Cited

U.S. PATENT DOCUMENTS 4,160,950 A * 7/1979 Houldsworth ............... 324/107
4,507,594 A    3/1985 Takemoto
4,525,669 A * 6/1985 Holberton et al. ........... 324/142

(Continued)

OTHER PUBLICATIONS

Martin Staebler, *TMS320F240 DSP Solution for Obtaining Resolver Angular Position and Speed*, Application Report, SPRA605, Texas Instruments, Feb. 2000.

(Continued)

*Primary Examiner*—Ha Nguyen
*Assistant Examiner*—Karen M Kusumakar
(74) *Attorney, Agent, or Firm*—Patterson, Thuente, Skaar & Christensen, P.A.

(57) ABSTRACT

A modular current sensing system for a servo control system that includes a magnetic core with an open center portion and a connection plate that includes at least three wire connectors, wherein the wire connectors are capable of connecting at least two wires electrically in series. The system also includes a plurality of wires, including a first wire with a first end and a second end, wherein the first end of the first wire is electrically connected to a first power source, and the second end of the first wire is connected to the connection plate at the first wire connector and wherein the first wire passes through the open portion defined by the magnetic core at least once. A first motor current flowing through the first wire induces a core current to flow in the magnetic core, causing the magnetic core to emit a magnetic field. A Hall effect sensor detects the magnetic field, produces an output current, and delivers the output current to a control device within a servo control system.

10 Claims, 24 Drawing Sheets

U.S. PATENT DOCUMENTS

| | | | |
|---|---|---|---|
| 4,609,855 A | | 9/1986 | Andrews |
| 4,639,665 A | * | 1/1987 | Gary ................. 324/117 H |
| 4,742,296 A | * | 5/1988 | Petr et al. ............... 324/142 |
| 4,779,031 A | | 10/1988 | Arends et al. |
| 5,038,090 A | | 8/1991 | Kawabata et al. |
| 5,285,378 A | | 2/1994 | Matsumoto |
| 5,642,013 A | | 6/1997 | Wavre |
| 5,646,496 A | | 7/1997 | Woodland et al. |
| 5,760,562 A | | 6/1998 | Woodland et al. |
| 5,771,393 A | | 6/1998 | Asghar et al. |
| 6,255,794 B1 | | 7/2001 | Staebler |
| 6,313,991 B1 | * | 11/2001 | Nagashima et al. ......... 361/699 |
| 6,366,076 B1 | * | 4/2002 | Karrer et al. ............ 324/117 R |
| 6,373,219 B1 | | 4/2002 | Obara et al. |
| 6,580,627 B2 | | 6/2003 | Toshio |
| 6,717,396 B2 | * | 4/2004 | Viola .................. 324/117 R |
| 6,954,060 B1 | * | 10/2005 | Edel ................... 324/117 R |
| 7,081,730 B1 | | 7/2006 | Howard et al. |
| 7,095,141 B2 | | 8/2006 | Groening |
| 7,109,670 B1 | | 9/2006 | Rehm |
| 2005/0007095 A1 | * | 1/2005 | Cattaneo et al. ......... 324/117 R |

OTHER PUBLICATIONS

Data Device Corporation, *Synchro/Resolver Conversion Handbook*, Fourth Edition, 1994.

Ahmet M. Hava, Russel J. Kerkman, Thomas A. Lipo, *A High-Performance Generalized Discontinuous PWM Algorithm*, IEEE Transactions on Industry Applications, vol. 34, No. 5, Sep./Oct. 1998.

Ahmet M. Hava, Russel J. Kerkman, Thomas A. Lipo, *Carrier-Based PWM-VSI Overmodulation Strategies: Analysis, Comparison, and Design*, Transactions on Power Electronics, vol. 13, No. 4, Jul. 1998.

Heinz Willi Van Der Broeck, Hans-Christoph Skudelny, Georg Viktor Stanke, Analysis and Realization of a Pulsewidth Modulator Based on Voltage Space Vectors, IEEE Transaction on Industry Applications, vol. 24, Jan./Feb. 1988.

* cited by examiner

MODULAR CURRENT SENSOR FOR MODULARIZED SERVO CONTROL SYSTEM

RELATED APPLICATION

The present application claims the benefit of U.S. Provisional Application No. 60/764,868 filed Feb. 3, 2006, which is incorporated herein in its entirety by reference.

GOVERNMENT INTEREST

The invention was made by an agency of the U.S. Government or under a contract with an agency of the U.S. Government. The name of the U.S. Government agency is the U.S. Army and the Government contract number is DAAE 30-92-C-1112.

FIELD OF THE INVENTION

The present invention relates to motor control applications and in particular to a modularized servo control system including a modular current sensing system capable of operating across heterogeneous high amperage power interfaces, and a modular thermal management system.

BACKGROUND OF THE INVENTION

Modern military procurement typically requires development of a family of systems in order to gain approval. Therefore, it is often desirable in military applications to provide modularized systems that can be utilized in numerous embodiments while maintaining broad applicability. For example, the Future Combat Systems (FCS) Manned Ground Vehicle (MGV) will share a common architecture that focuses on high performance, commonality, and reliability. Control systems that are used on military vehicles such as the MGV vary widely depending on the assigned task. More specifically the servo control system must be capable of driving widely varying motor loads encountered in a family of military vehicles. Moreover, the servo control must be lightweight and have a small volume. The FCS system will incorporate many servo controlled motors and actuators. For example, the Non-Line of Sight (NLOS) cannon requires motor/actuator control for index magazine, close breech, raise load arm, track gun sight and other operations.

To move an object and position it at a predetermined location, a servomotor and servo control circuit are required as motive sources for obtaining a rotational position, velocity, torque and the like, which are in accordance with commanded data. Servo control is executed to produce an output based on a comparison between an externally applied command signal input and a feedback signal indicative of the state of the servomotor.

A variety of brushless DC and AC induction motors are commonly used in this type of military servo control application. Typically, the motors used in these applications are controlled by commutating the current supplied to the stationary windings. Rotor position sensors are usually included as an integral part of the motor and provide the controller with signals that indicate the position of the rotor magnets relative to the stator windings. To achieve high efficiency, control of the motor current is accomplished by pulse-width modulating solid state switches, usually power-switching transistors.

To accurately and reliably control the current as required in such an application, military servo control systems employ sensitive current sensors to determine real-time current flow to the servo motor. Typically, multiple current sensors will be used to measure a motor's primary and secondary windings, including individual phase windings. In the case of a Hall-based current sensor, a current-carrying wire is passed through, and wound around, a magnetic core, while a Hall effect sensor detects a magnetic field induced in the core. A number of factors may affect the accuracy of the current sensor, but the number of turns around the core is a primary factor.

When the servo control system controls multiple motors of different sizes, the number of different current sensors used in a system increases. One solution to this problem has been to simply sacrifice current sensing accuracy by using a current sensor optimized for a particular current, across a wide range of motor currents. This optimizes accuracy within a narrow range of measured currents, but seriously decreases accuracy at the outer ranges. In military servo control systems, sacrificing accuracy is usually not an option. Another solution has been to design and use different current sensors for each motor size. However, in military applications that value modularity and commonality, carrying an inventory of many different motor-specific current sensors is not a practical solution.

Accurately and reliably sensing high amperage motor current relies upon consistent, reliable operation of the greater servo control system. As such, another critical component of any servo control system is an efficient thermal management system. This is especially true in a military servo control system serving a wide range of high amperage servo motors.

Therefore, a need exists for a universal high-amperage current sensing system, along with a versatile thermal management system, that can accurately and reliably serve a wide range of servo motors in a greater servo control system.

SUMMARY OF THE INVENTION

One embodiment of the present invention is a modular current sensing system for a servo control system that includes a magnetic core with an open center portion and a connection plate. The connection plate includes at least three wire connectors, wherein each wire connector is capable of connecting at least two wires electrically in series. The system also includes a plurality of wires, including a first wire with a first end and a second end, wherein the first end of the first wire is electrically connected to a first power source, and the second end of the first wire is connected to the connection plate at the first wire connector and wherein the first wire passes through the open portion defined by the magnetic core at least once. A first motor current flowing through the first wire induces a core current to flow in the magnetic core, causing the magnetic core to emit a magnetic field. A Hall effect sensor detects the magnetic field, produces an output current, and delivers the output current to a control device within a servo control system.

Another embodiment of the present invention is a method for sensing current flowing from a power source to a motor in a servo control system. The method includes generating a primary current in a power source, conducting the primary current through a first primary wire, winding the primary wire about a magnetic core, and inducing a first core current and a first magnetic field in the magnetic core. The method also includes connecting the primary wire to a connection plate, conducting the primary current through the connection plate, through a splice device, back through the connection plate, and into a second primary wire. The second primary wire is wound about the core, inducing a second core current in the magnetic core and a second magnetic field. The method further includes sensing the first and second magnetic fields with a Hall effect sensor, generating an output current proportional to the sum of all core currents, and sending the output current to a control device in a servo control system.

Another embodiment of the present invention is a thermal management system integrated into a servo control unit and servo power electronics system. The thermal management system includes a power-side distribution manifold including at least one connection port and at least one fluid connector. This manifold also forms a cooling plate for the servo power electronics system. The thermal management system also includes a plurality of control-side distribution manifolds. Each of these control-side distribution manifold includes an inlet connected to the power-side distribution manifold and an outlet connected to the power-side distribution manifold. Also included are a plurality of control-side cold plates that provide cooling for electronics located in the servo control unit. The cold plates are connected to the control-side distribution manifolds. The system further includes a frame supporting the cold plates and control-side manifolds and a coolant flowing through the power-side distribution manifold, inlets, outlets, control-side manifolds and cold plates.

Yet another embodiment of the present invention is a method of simultaneously managing the thermal properties of a servo control unit and servo power electronics system. The method includes locating a servo power electronics system distribution manifold beneath a set of power electronics and also locating a plurality of servo control unit distribution manifolds in a servo control unit. Next is connecting a servo control unit distribution manifold to a servo power electronics system manifold via a plurality of inlets and outlets and connecting a plurality of cold plates to each servo control distribution manifold. The method also includes supporting the cold plates and the servo control unit distribution manifolds with a support frame. Other steps include flowing a coolant from the servo power electronics system through the outlets and into the servo control unit manifolds, flowing the coolant from the servo control unit manifolds into the plurality of cold plates and flowing the coolant from the servo control unit manifolds through the outlets and back into the power-side distribution manifold.

The above summary of the invention is not intended to describe each illustrated embodiment or every implementation of the present invention. The figures and the detailed description that follow more particularly exemplify these embodiments.

DETAILED DESCRIPTION OF THE DRAWINGS

Figure 1:
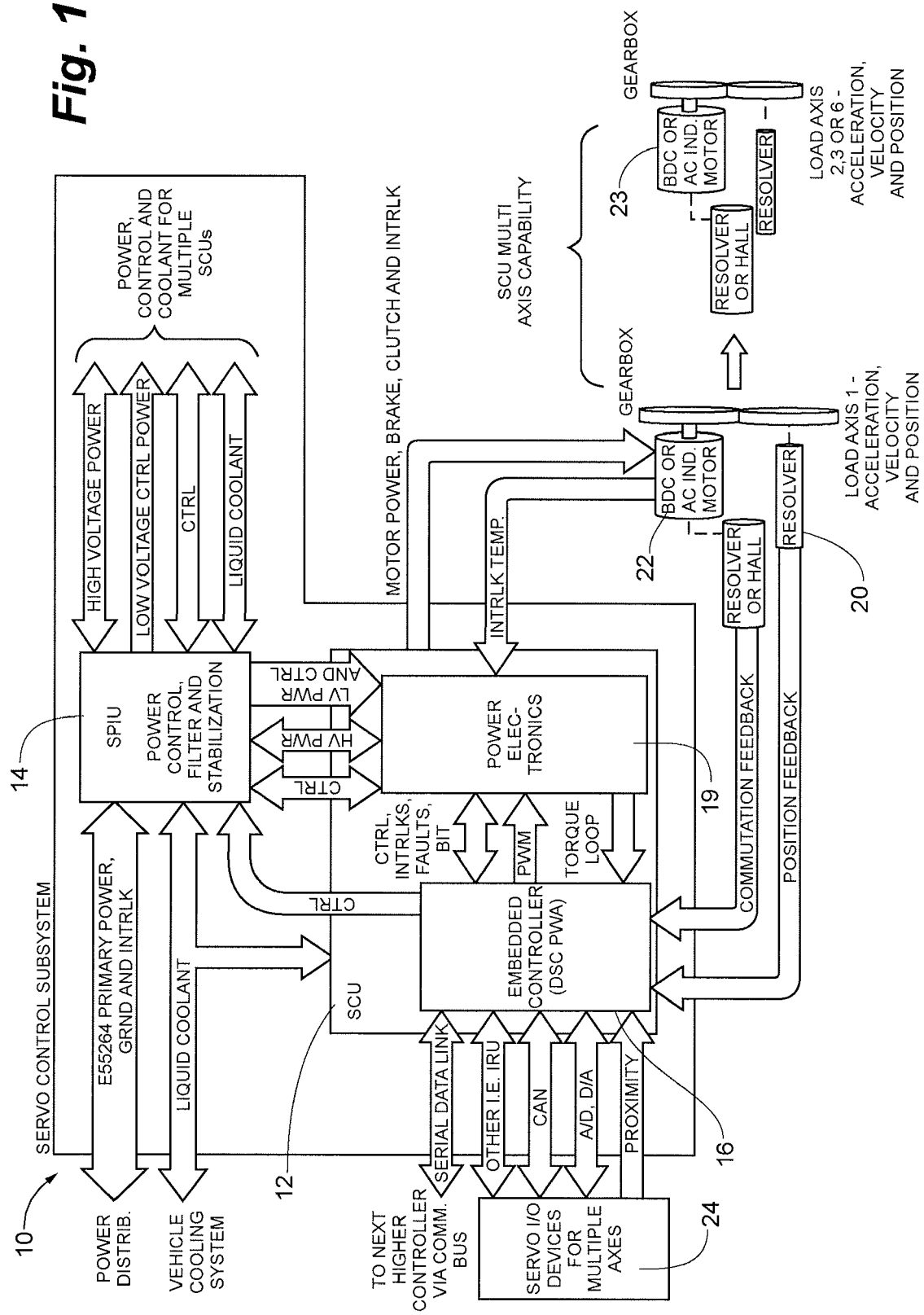
FIG. 1 is a block diagram of an SCS architecture and interaction with a host vehicle.

FIG. 1 depicts a first embodiment of SCS 10, which is comprised of an SCU 12 and an SPIU 14. The SPIU 14 includes power control, filter and stabilization to the SCU 12. In one embodiment, the SCS 10 via SPIU 14 receives a 600V and 28V power input. The SPIU 14 is operably connected to the host vehicle cooling system and host vehicle power distribution system. It is envisioned that the manifold system will be used to distribute coolant to the various SCU 12 components as required by their respective thermal power dissipations. The SCU 12 is comprised of an embedded controller 16 and a power electronics system 19. The embedded controller 16 receives position and commutation feedback from resolver 20 attached to the motor 22. The embedded controller 16 also communicates with the next higher controller and numerous Servo I/O devices 24 required for multiple axes servo operations. The motor 22 may be a brushless DC motor or an AC inductor motor. The power electronics system 19 directs operation of the motor 22, providing power, brake commands, and clutch commands. As further indicated by FIG. 1, the SCS 10 has multi-axis control capability through additional motors 23.

Figure 2:
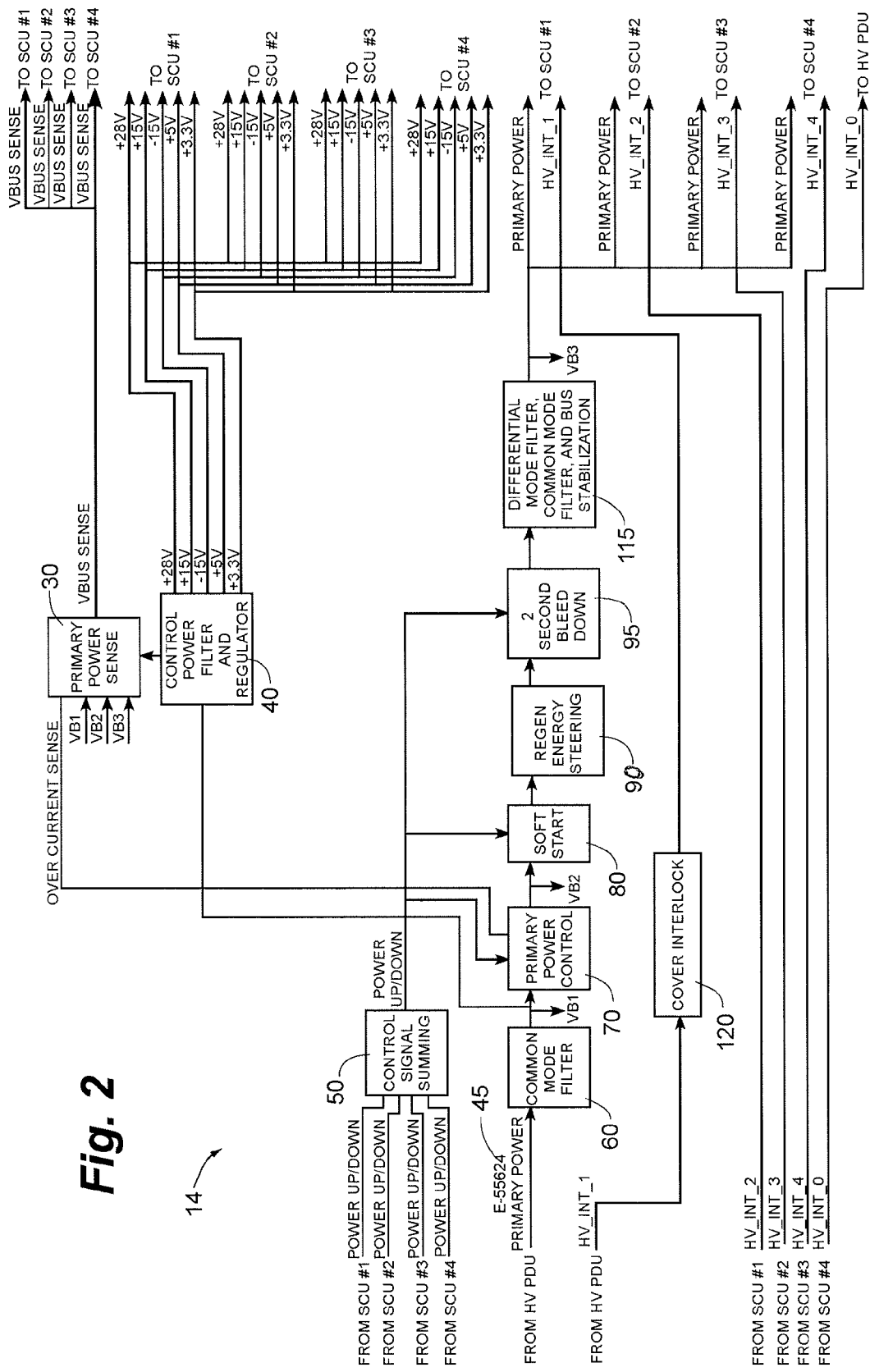
FIG. 2 is a functional block diagram of a first embodiment of the SPIU.

FIG. 2 is a functional block diagram of the SPIU 14. The functions of the SPIU 14 include:

Primary power control to SCUs 12 (includes hard start, soft start, regenerative energy steering, and shut down and over current sensing);
Primary power soft start;
Primary power bleed down;
Primary power bus EMI filtering;
Primary power bus stabilization;
Control power down converter;
  Control power bus EMI filtering
  Control power bus regulation
Primary power sensing;
Assembly cover interlock.

The SPIU 14 includes the following systems in order to perform the functions listed above:

Primary Power Sense 30

The Primary Power Sense Block 30 receives voltages from three different points on the primary power bus and a signal representing the current level in the primary power bus. It then conditions these signals and outputs the conditioned signals to the attached SCUs 12.

Control Power Filter and Regulator 40

The Control Power Filter and Regulator Block 40 takes the primary power 45 and down converts it to the levels shown. All the outputs are filtered and isolated from each other (except the +/−15V outputs which share a return), from the input and from chassis. In the first embodiment, output power is down converted to +28V, +15V, −15V, +5V and +3.3V.

Control Signal Summing 50

The Control Signal Summing Block 50 receives the Power Up/Down signals from the attached SCUs 12 (1 through 4) and combines them using a Boolean AND function. It outputs this signal to the 3 different sets of contactors that are controlled by the SCUs 12.

Common Mode Filter 60

The Common Mode Filter Block 60 filters the primary power bus input to the SCU 12 to reduce the susceptibility of downstream circuitry to conducted noise that is present on the bus as defined by E-55624 and MIL-STD-461. This block also reduces conducted emissions caused by downstream circuitry to levels that are below the limits established in E-55624 and MIL-STD-461. It outputs to the Primary Power Control Block 70.

Primary Power Control 70

The Primary Power Control Block 70 controls the application of primary power to the SCU 12. It is controlled by the output of the Control Signal Summing block 50. It outputs to the Primary Power Sense Block 30 and the Soft Start Block 80.

Soft Start 80

The Soft Start Block 80 controls the application of the soft power resistor used to limit the inrush current when primary power 45 is first supplied to the attached SCUs 12. When the contacts are engaged the resistor is bypassed. It is controlled by the output of the Control Signal Summing block 50.

Regen Energy Steering 90

The Regen Energy Steering Block 90 provides a path for power to feedback from the SCU 12 and motor to the primary power bus when the system is in regeneration mode.

Two-Second Bleed Down 95

The 2 Second Bleed Down Block 95 provides a means to bleed the voltage off the system when primary power 45 is disengaged. The circuit is designed to bleed down the voltage to 30V with respect to chassis within 2 seconds of primary power 45 being turned off. It is controlled by the output of the Control Signal Summing block 50.

Differential Mode Filter, Common Mode Filter, and Bus Stabilization 115

This block 115 filters the primary power bus to reduce the susceptibility of downstream circuitry to conducted noise that is present on the bus as defined by E-55624 and MIL-STD-461. 2) Reduces conducted emissions caused by downstream circuitry to levels that are below the limits established in E-55624 and MIL-STD-461. 3) Provide stabilization of the high voltage bus to the attached SCUs 12.

Cover Interlock 120

The Cover Interlock Block 120 senses the removal of one of the SPIU's covers. The switches are closed when the covers are on and open when a cover is removed. Upon removal of a cover the PDU will sense the high impedance state and remove high voltage power from the unit.

Figure 3:
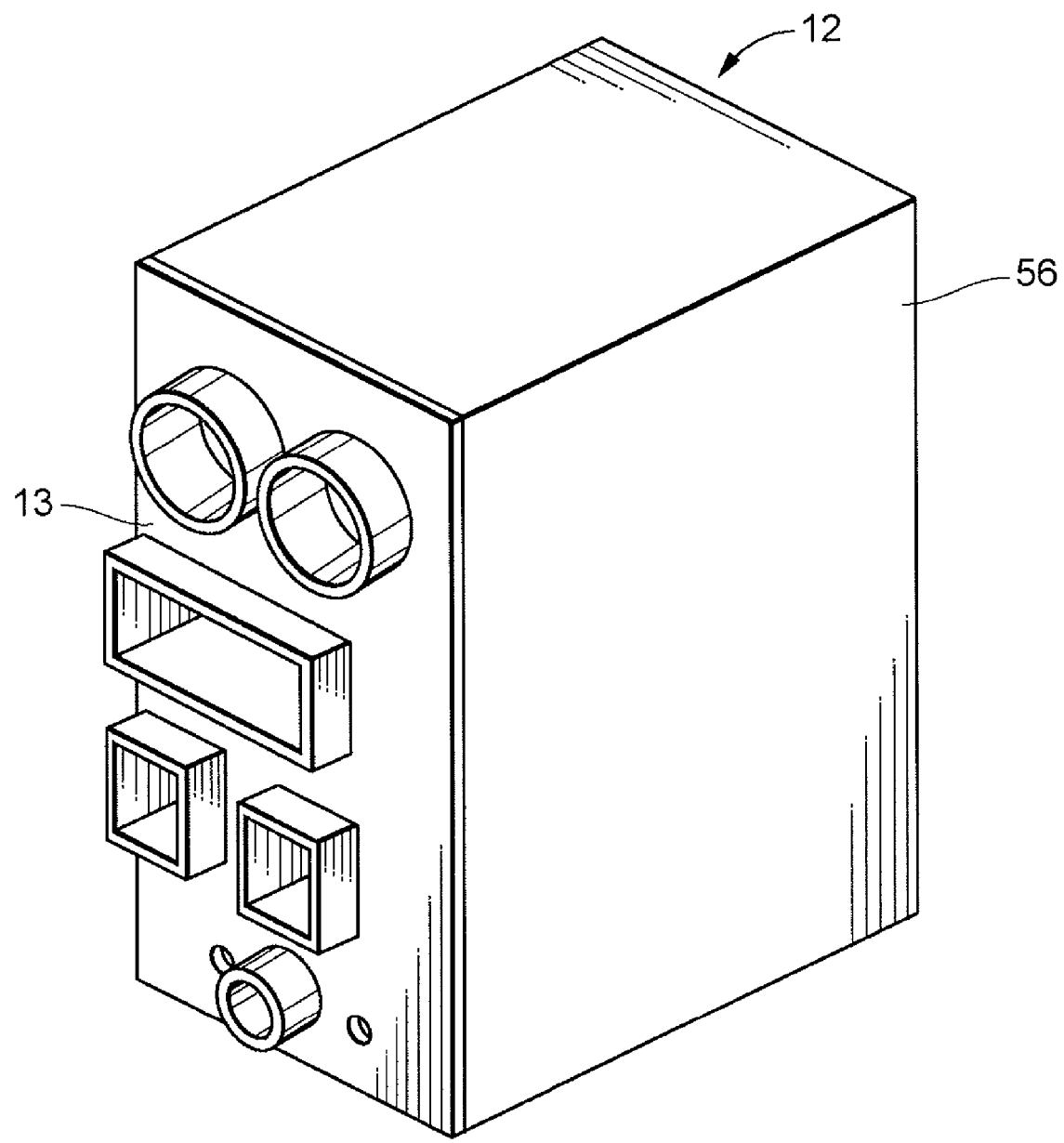
FIG. 3 is a perspective view of a first embodiment of the SCU mechanical concept.
Figure 4:
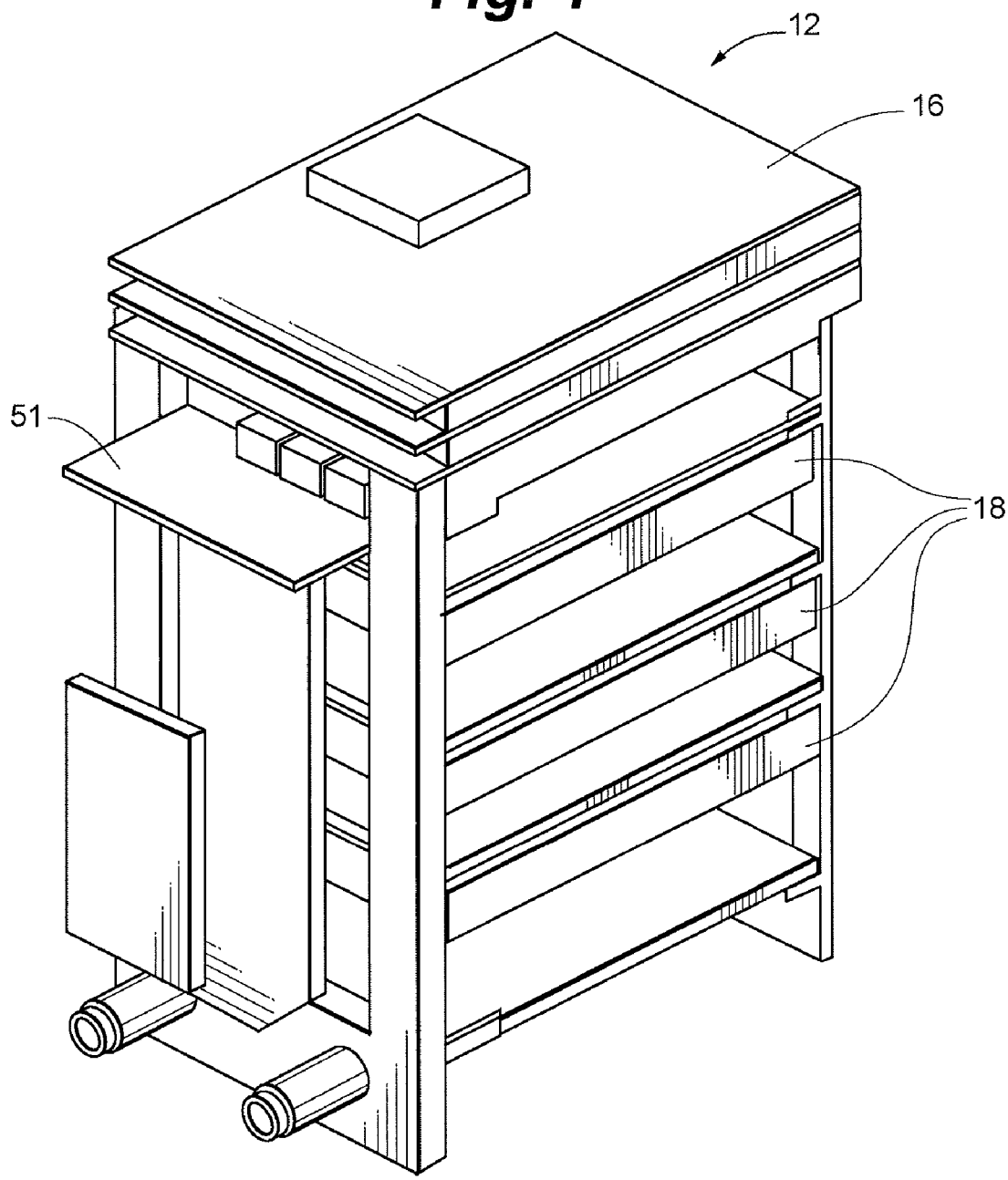
FIG. 4 is a perspective view of the first embodiment of the SCU with case removed.
Figure 5:
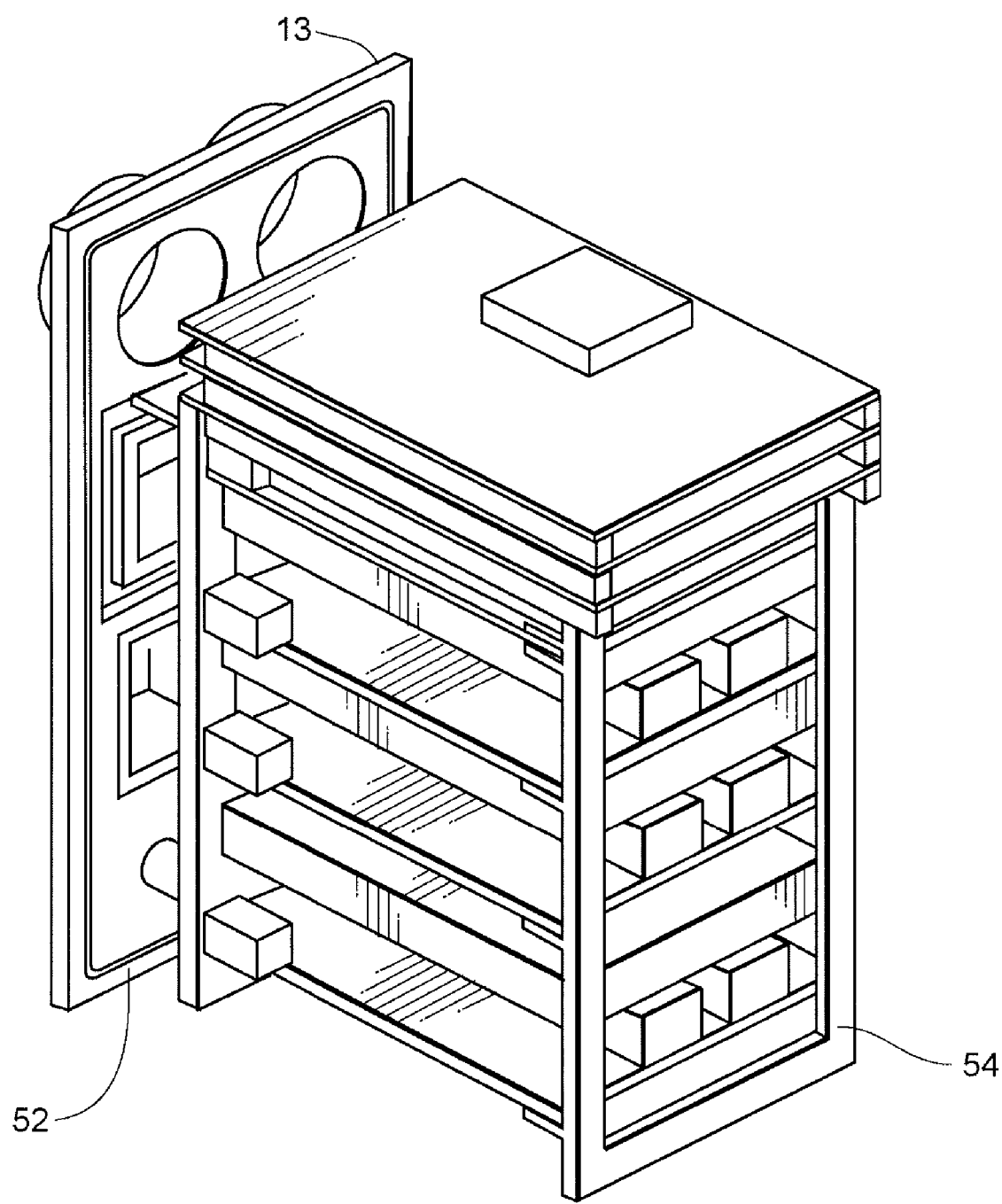
FIG. 5 is an opposing perspective view of the first embodiment of the SCU with case removed.
Figure 6:
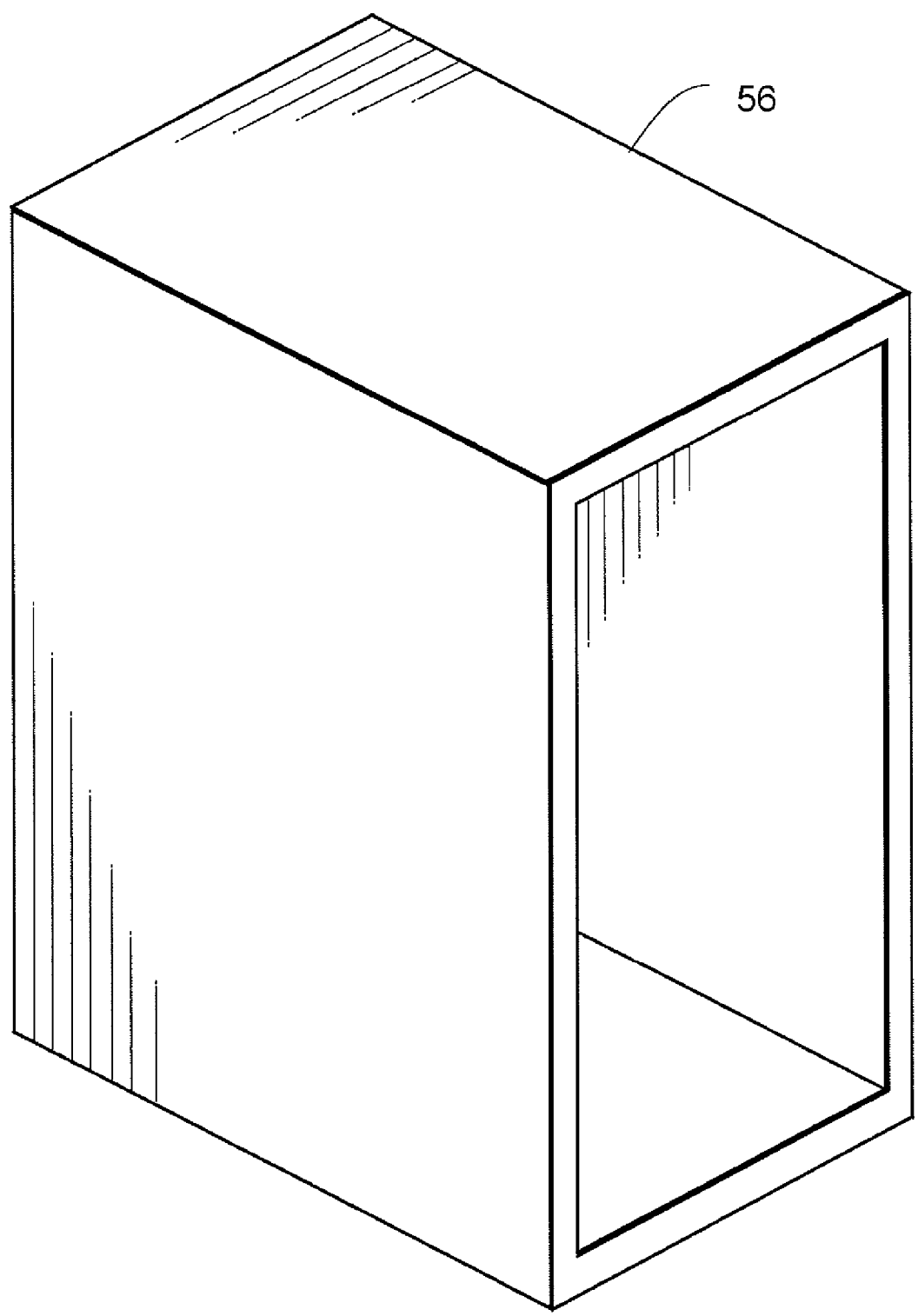
FIG. 6 is a perspective view of the first embodiment of the SCU metallic case.

FIGS. 3-8 are perspective views of embodiments of the SCU 12. The SCU 12 is comprised of two main assemblies, the Digital Servo Controller (DSC) 16 and the High Power Amplifier (HAMP) 18. As illustrated in FIG. 3, the SCU 12 is a rectangular structure with a connector plate 13 at one end. As illustrated in FIG. 4, a ground plane 51 with filtered feed-through connectors separate the DSC 16 section from the HAMP 18 section. As illustrated in FIG. 5, the electronic components rest on a grounded electronics rack 54. A conductive connector plate 52 with an EMI gasket is mounted at a first end. The SCU 12 is placed in a metallic enclosure 56 as illustrated in FIG. 6. In the first embodiment there are multiple HAMP 18 units.

Figure 7:
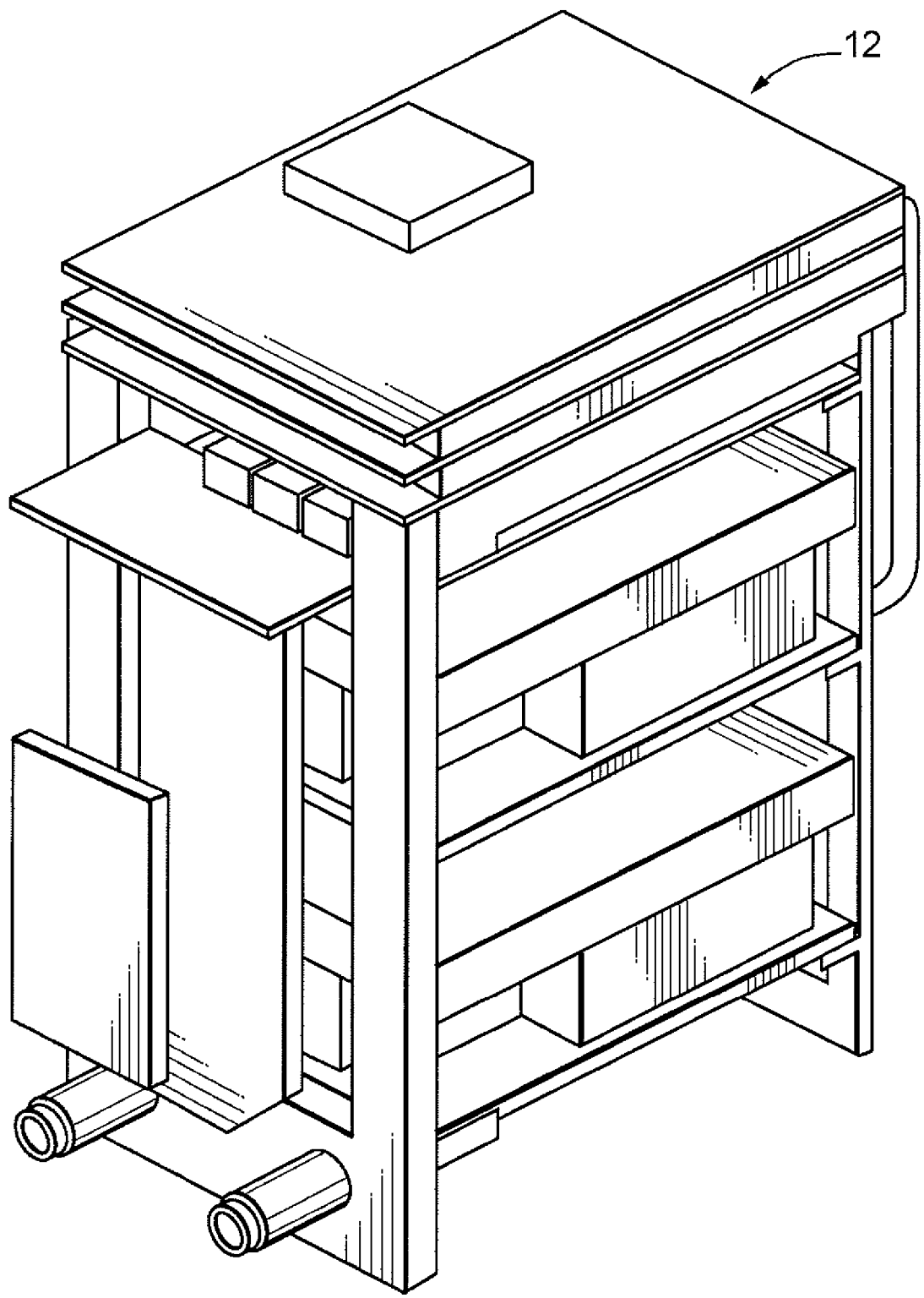
FIG. 7 is a perspective view of the components of a second embodiment of the SCU.

FIG. 7 is a perspective view of the components of an embodiment of the SCU 12. The functionality and features of this second embodiment include:

(1) Capable of supplying power to and controlling 2 motors (Brushless DC, AC induction or a combination of the two).
(2) Per axis motor phase current capability is rated at 40 Arms continuous and 80 Arms peak. Peak and continuous phase current limits can be tailored, up to the rated values, to support a range of motor loads.
(3) Dual Redundant Serial Communication Bus interface.
(4) Interface Capability.
  (a) 8-2A/28V Brake/Clutch/Solenoid Driver Outputs.
  (b) 2-CAN Bus Interface Circuits.
  (c) 15-Type A-A/D Inputs, 3 wire circuit (power, signal and ground with pull up resistor), used on hall effect devices, proximity switches, color devices, limit switches, RTD devices and interlock switches.
  (d) 6-Type B-A/D Inputs, 4 wire circuit (power, power return, signal and signal return-power and signal circuits are isolated in the sensor), used on pressure sensors, temperature sensors, humidity sensors, position sensors and color sensors.

(e) 3-D/A Outputs.
(f) 3-Load Resolver Interface circuits, each circuit consists of a reference output, sine input to a Type B—A/D circuit, cosine input to a Type B—A/D input circuit.
(g) 1-RS422 Interface Circuit.
(5) 3-Motor Signal Interface circuits, each circuit consists of a reference output, sine input to a Type B—A/D circuit, cosine input to a Type B—A/D input circuit and a RTD Input to a Type A—A/D input.
(6) Embedded control capability safeguards personnel and equipment.
(7) Torque control mode using sinusoidal or trapezoidal current control capability.
(8) User defined velocity control mode capability.
(9) User defined position control mode capability.
(10) User defined maintenance and local coordinator capability.
(11) Works in conjunction with the SPIU 14 to provide 600 V Bus over current, ground fault, over voltage and safety interlock protection.
(12) Degraded mode capability for 600 V Bus low line conditions.
(13) Primary Power Up/Down Control.
(14) Heat sink thermal monitor with fold back to degraded mode.
(15) Output power electronics under voltage protection, short circuit protection and per junction temperature protection.
(16) Safety interlock for motor power outputs.
(17) Supports motor thermal protection with fold back to degraded mode.
(18) Battle over-ride capability.
(19) Test Connector.
(20) BIT and prognostics capability.

Figure 8:
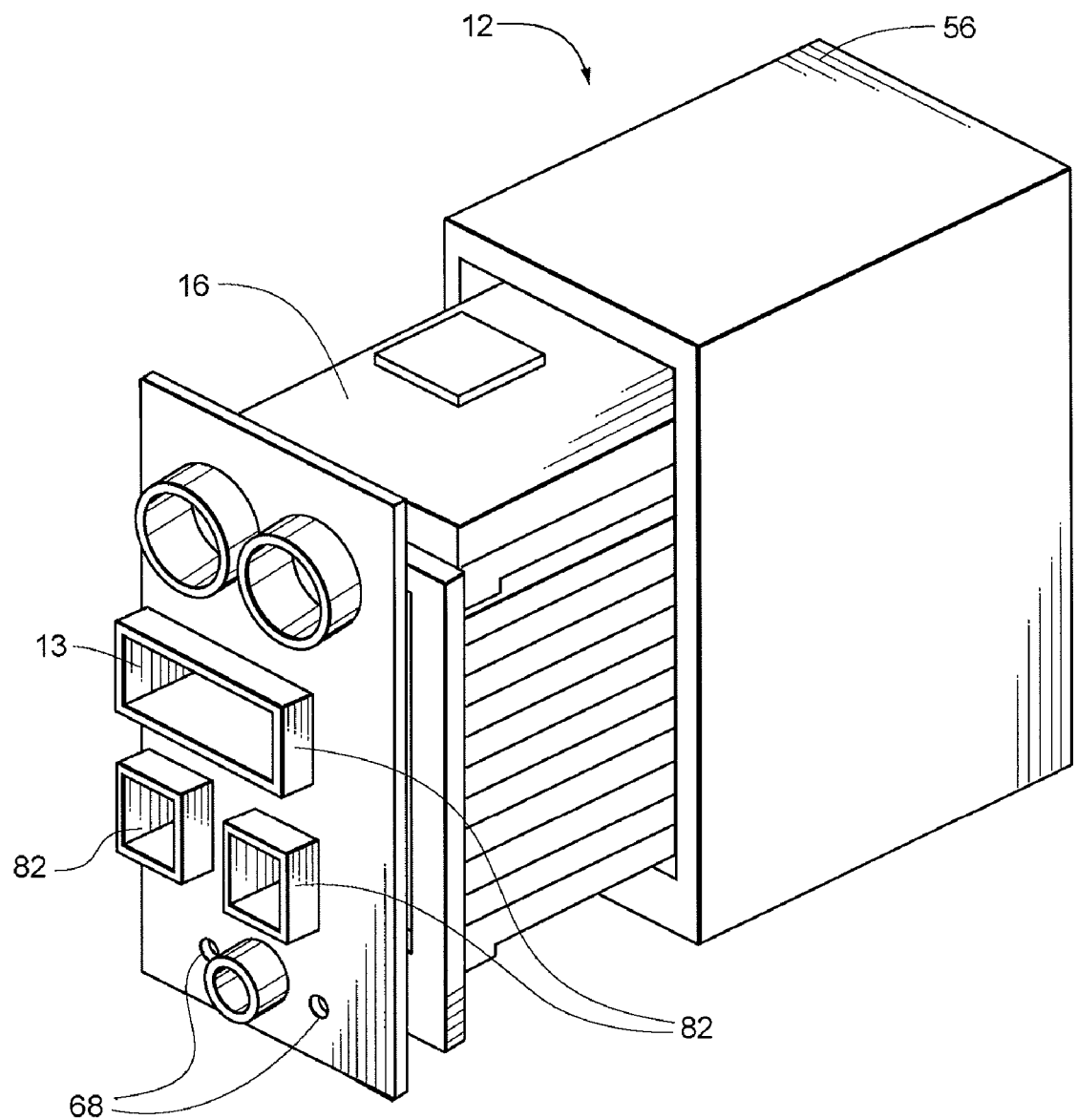
FIG. 8 is a perspective view of the SCU concept common embodiment features.

FIG. 8 is a perspective view of the SCU 12 concept common embodiment features. In one embodiment, all SCU 12 embodiments will have the same external interfaces and dimensions. The manifold, electronics and cold plates are assembled to the connector plate 13, which includes blind mate fluid connectors 68 and electrical connectors 82, which is then slid into the SCU 56 enclosure.

Figure 9:
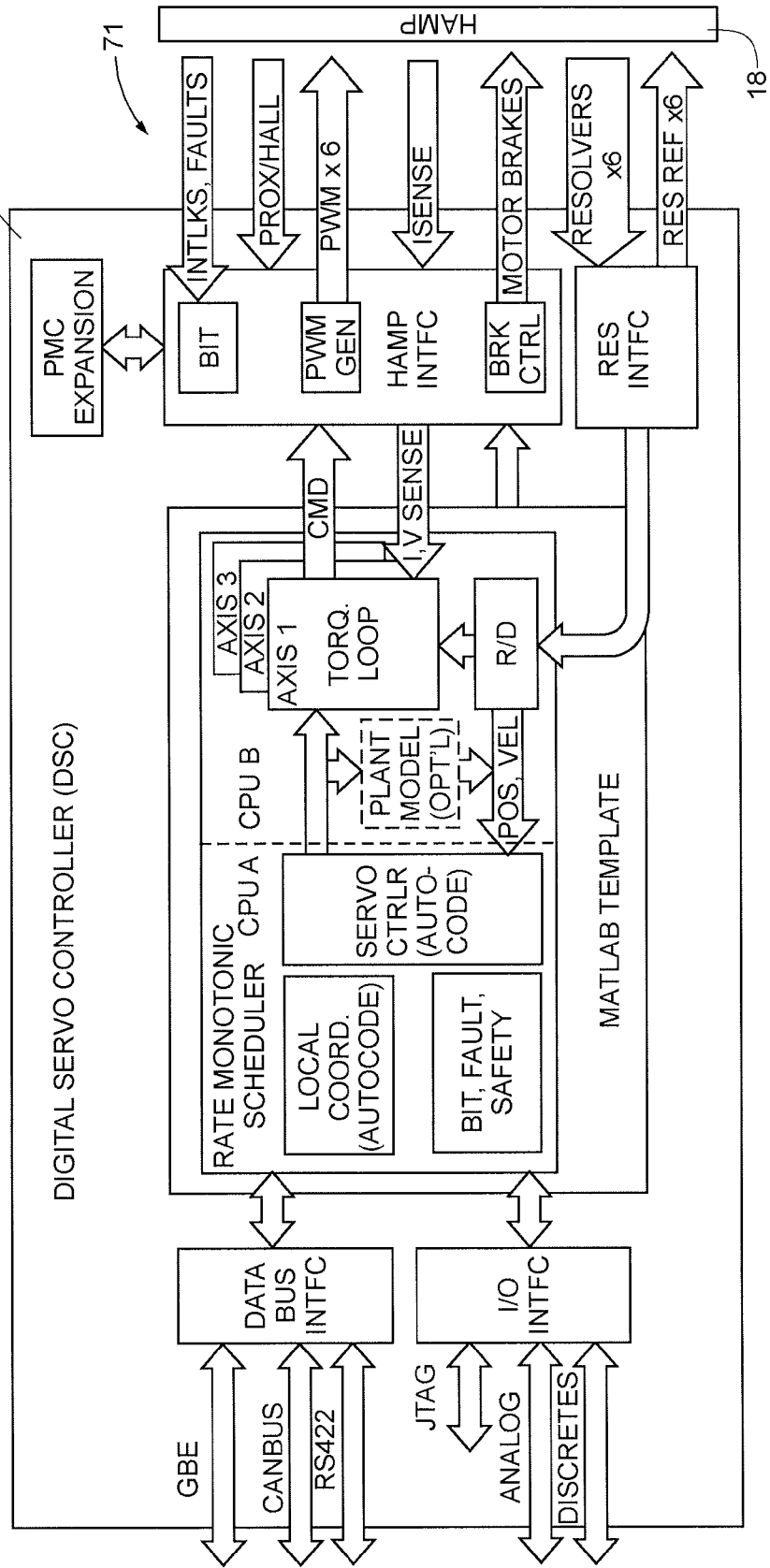
FIG. 9 is functional block diagram of the digital servo control of the SCS system.
Figure 10:
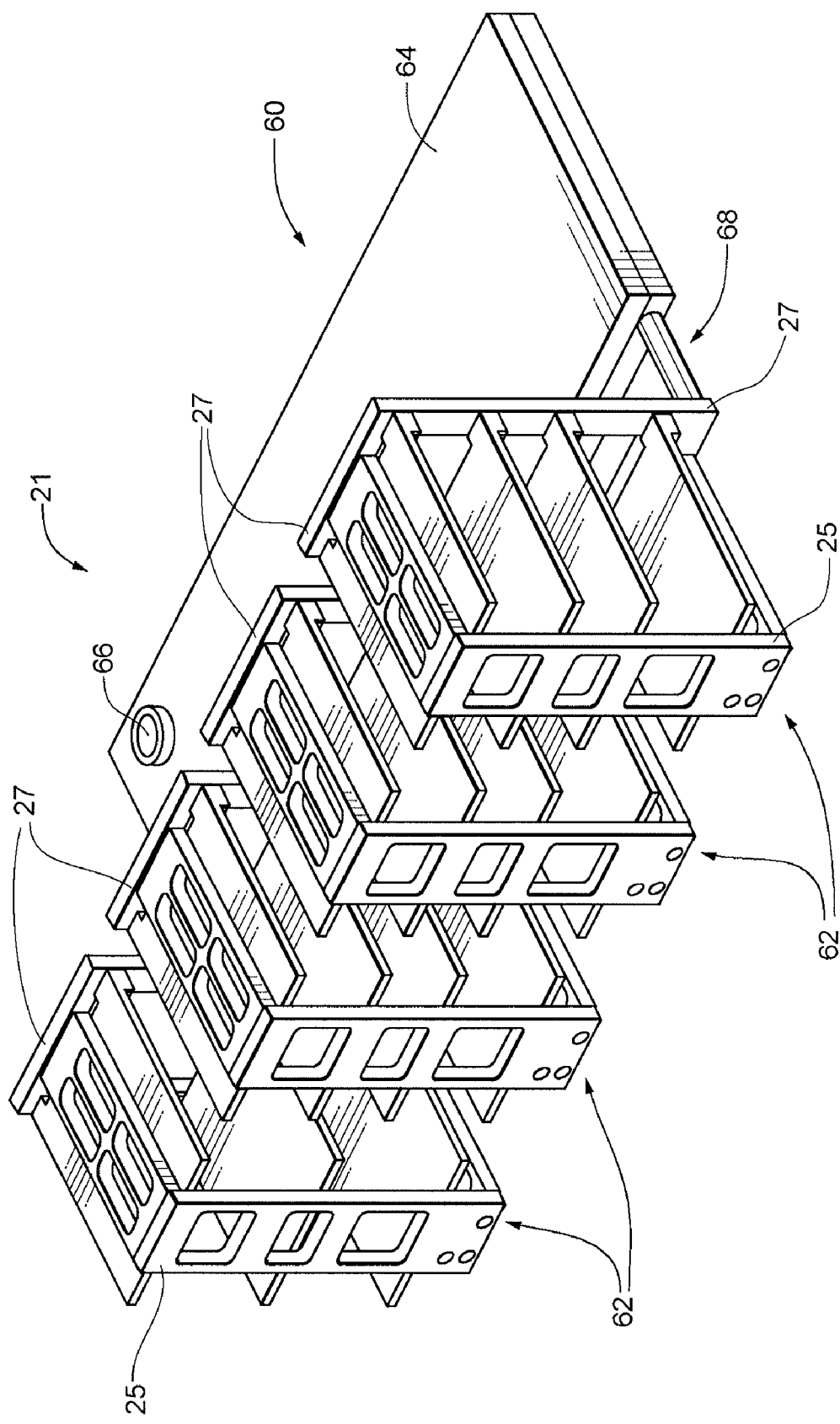
FIG. 10 is a perspective view of the SCS thermal management system cold plates and manifolds.

FIG. 9 is functional block diagram of the Digital Servo Control 16 of the SCS 10. The Digital Servo Controller (DSC) 16 is an embedded control circuit card residing inside the SCU 12. The DSC 16 provides closed-loop motion control, motor command, fault control, and motion safety for all the supported axes of motion in the Future Combat System's Manned Ground Vehicles. The DSC 16 provides the computing, signal processing, and motion control functionality for the SCU 12. The DSC 16 runs three separate torque loops (each capable of running at 10 kHz), three separate velocity loops, and three separate position loops. The DSC 16 can also accept MATLAB/SIMULINK velocity and position loop control models via its auto coding capability. Additionally, the DSC 16 can store and run plant models making it extremely useful as a control system development platform.

The DSC 16 is the 2- or 3-axis (depending on type) motion controller component of the SCU 12 providing low-level position, velocity, and torque brushless DC servo motor control. The HAMP interface 71 is one of many important interfaces to the DSC 16. The DSC 16 senses motor position from resolvers and senses current using current sensing systems flowing through the power switches in the HAMP 18. Current feedback closes the torque loop, and resolver feedback from the motor and load closes the velocity and position loops, respectively. The DSC 16 then generates a PWM motor command to the HAMP 18 twice per loop update. The DSC 16 communicates with the next higher level of control over a dual redundant, medium-speed, serial bus in the form of command, data, control, and status packets. Digital and analog discrete I/O interface to the SCU 12 and to the outside, providing additional status for Built-In Test (BIT) and safety.

The DSC 16 communicates to the Integrated Computer Unit (ICU) via GBE serial ports. CANBUS (ISO 11898), RS422, and assorted other discrete I/Os interface to devices necessary to make it function, and necessary to provide the flexibility and commonality for application over a wide variety of platforms. Two key components define the DSC—the processor, and the Field Programmable Gate Array (FPGA). The processor consists of one or more DSPs or RISC processors that together provide the control to the motors. Each processor performs specific, individual functions. The FPGA provides the interface between the supported I/O devices and the processor, manages external memory resources, and numerous other motion-related functions. Processors communicate with the FPGA via individual local busses. Each 32-bit bus contains SDRAM memory and flash dedicated to each DSP. Flash memory serves to initialize the processor at power up. DDR-RAM, external to the FPGA, provides the necessary memory over a 32-bit memory bus for two Power PC processors embedded in the FPGA. External flash memory contains the configuration files for the FPGA, controlled by a Complex Programmable Logic Device (CPLD). Analog-to-Digital (A/D) and Digital-to-Analog (D/A) modules interface to the FPGA over separate 14-bit busses to further improve overall DSC processing performance.

FIGS. 10-15 are perspective views of the SCS thermal management system 21. SCS thermal management system 21 includes SPIU power-side thermal management system 60 and one or more SCU thermal management system 62.

Each SPIU power-side thermal management system includes an SPIU manifold 64, one or more ports 66, and one or more blind fluid connectors 68. SPIU manifold 64 functions as both a cold plate for the SPIU 14, and as a distribution manifold for SCU thermal management systems 62.

Figure 11:
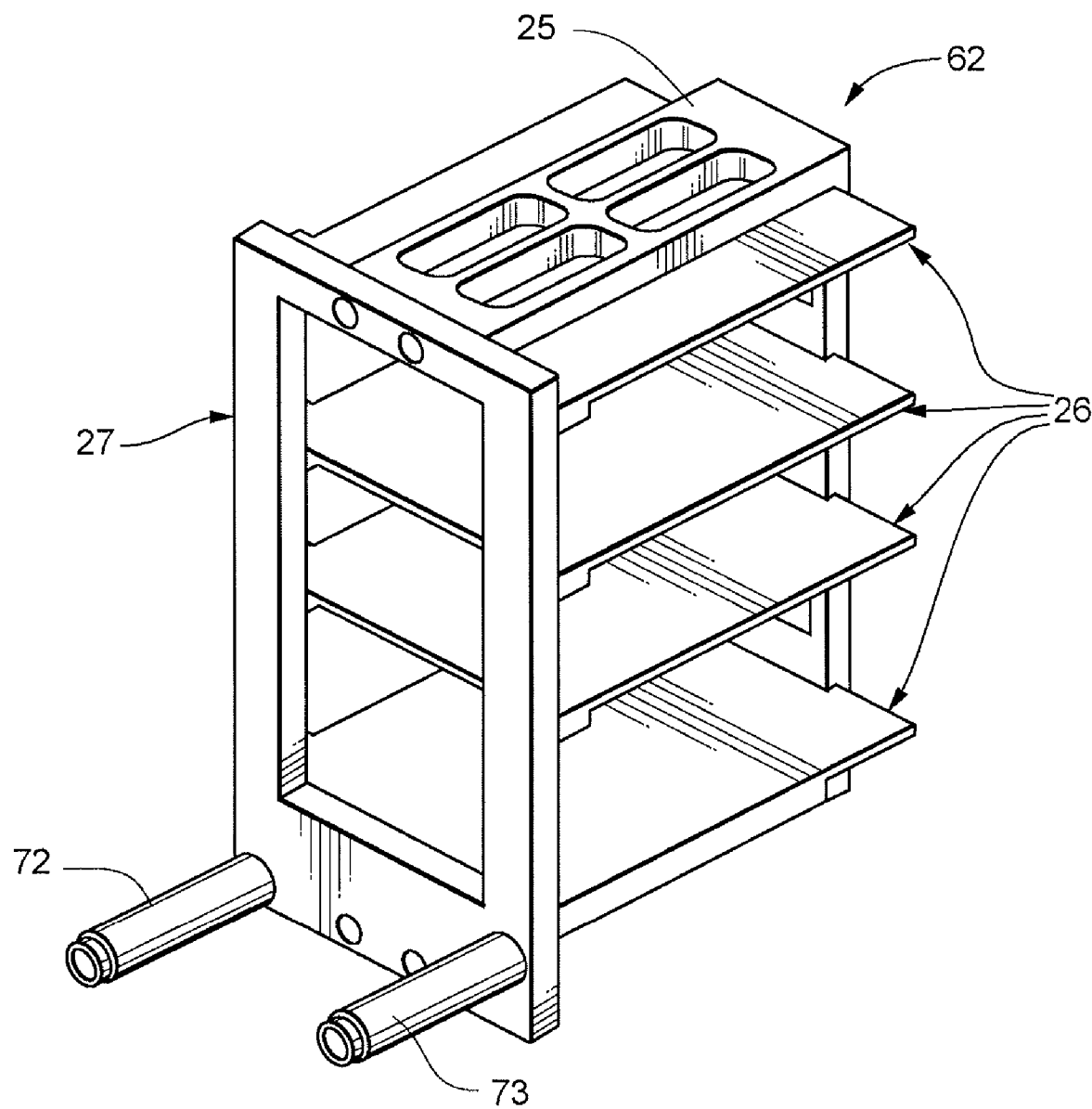
FIG. 11 is a perspective view of the SCU structure with thermal management system.
Figure 12:
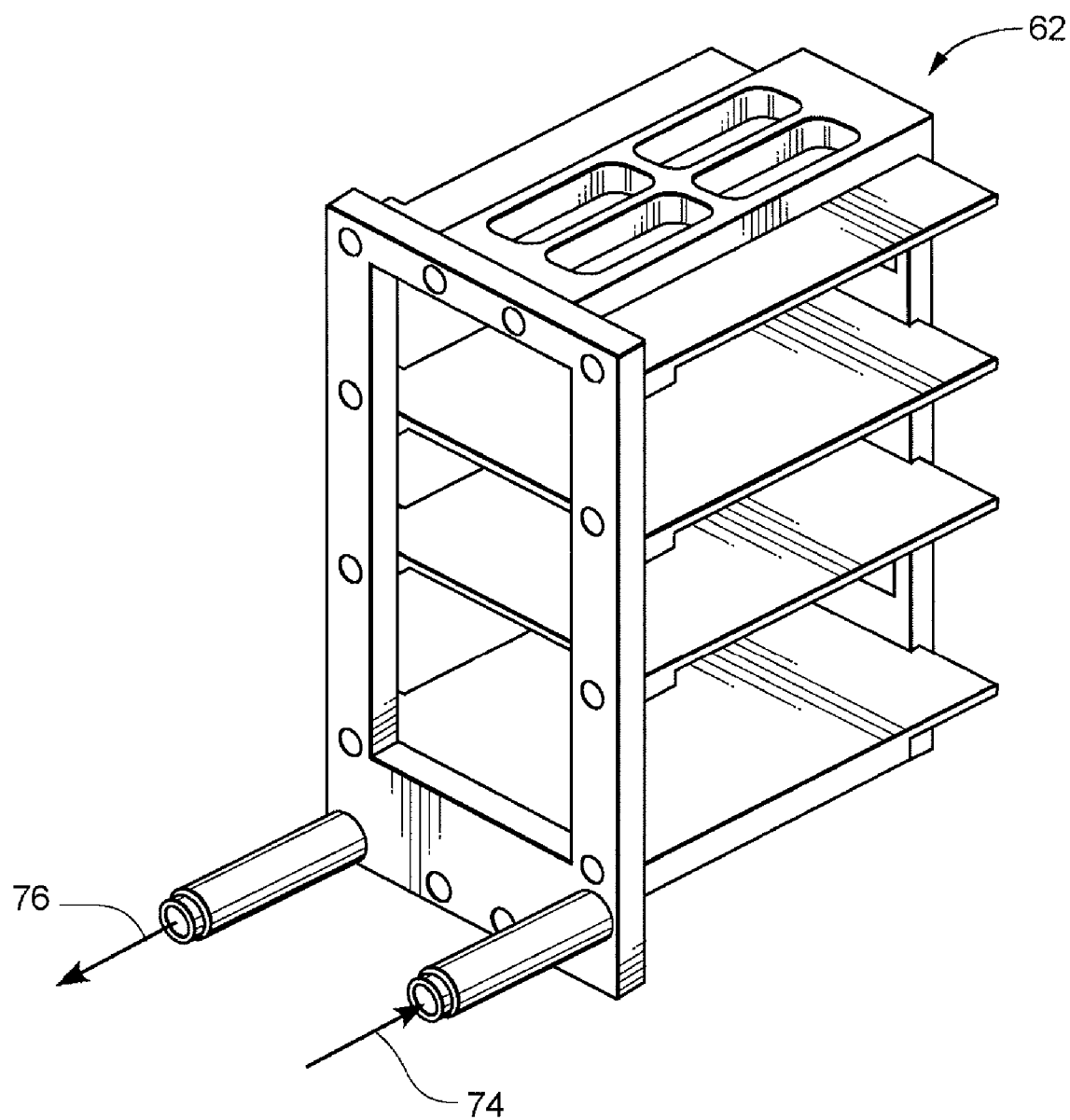
FIG. 12 is a perspective view of the coolant path of the SCU thermal management system.
Figure 13:
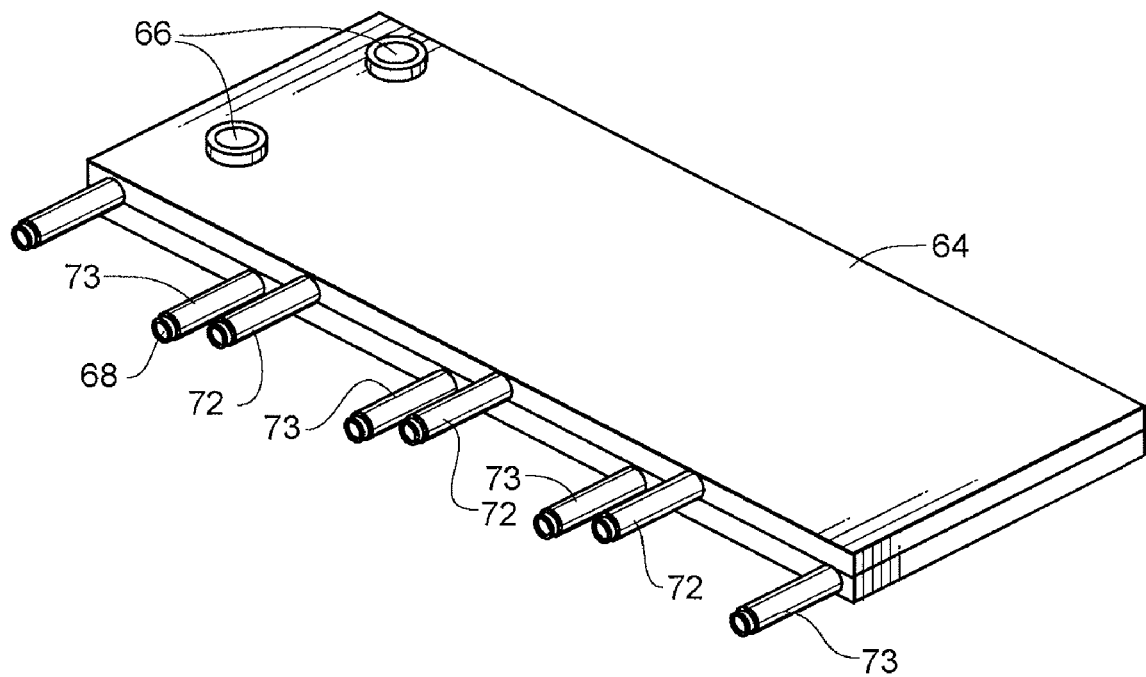
FIG. 13 is a perspective view of the thermal management system parallel flow manifold of the SPIU.

FIGS. 11 and 12 depict an SCU thermal management system 62. SCU thermal management system 62 includes a frame 25, a plurality of cold plates 26, SCU manifold 27, inlet 73, and outlet 72. Frame 25 provides support for the multiple layers of electronic components. Cold plates 26 are attached to the frame 25 forming platforms for the electronic components. The SCU manifold 27 branches to the cold plates 26 to supply coolant. The SCU manifold 27 is fastened to the connector plate 13 to meet shock and vibration requirements. Cross braces (not shown) may be used to connect the manifold 27 to the frame 25 as needed.

Referring again to FIGS. 10-13, the manifold 27 delivers the coolant to the cold plates 26. The coolant delivery begins at the rear of the SPIU manifold 64, with coolant traveling into each SCU thermal management systems 62 via fluid connectors 68, which may be blind mate fluid connectors, and inlet 73, in the direction indicated by arrow 74. Inside the SCU thermal management system 62, the coolant is delivered to the cold plates 26 via SCU manifold 27. The coolant then follows a similar return path exiting SCU manifold 27 via outlet 72 and blind connector 68, in the direction indicated by arrow 76. Coolant then enters the rear of the SPIU 14 where it will then exit the SCS 10.

Figure 14:
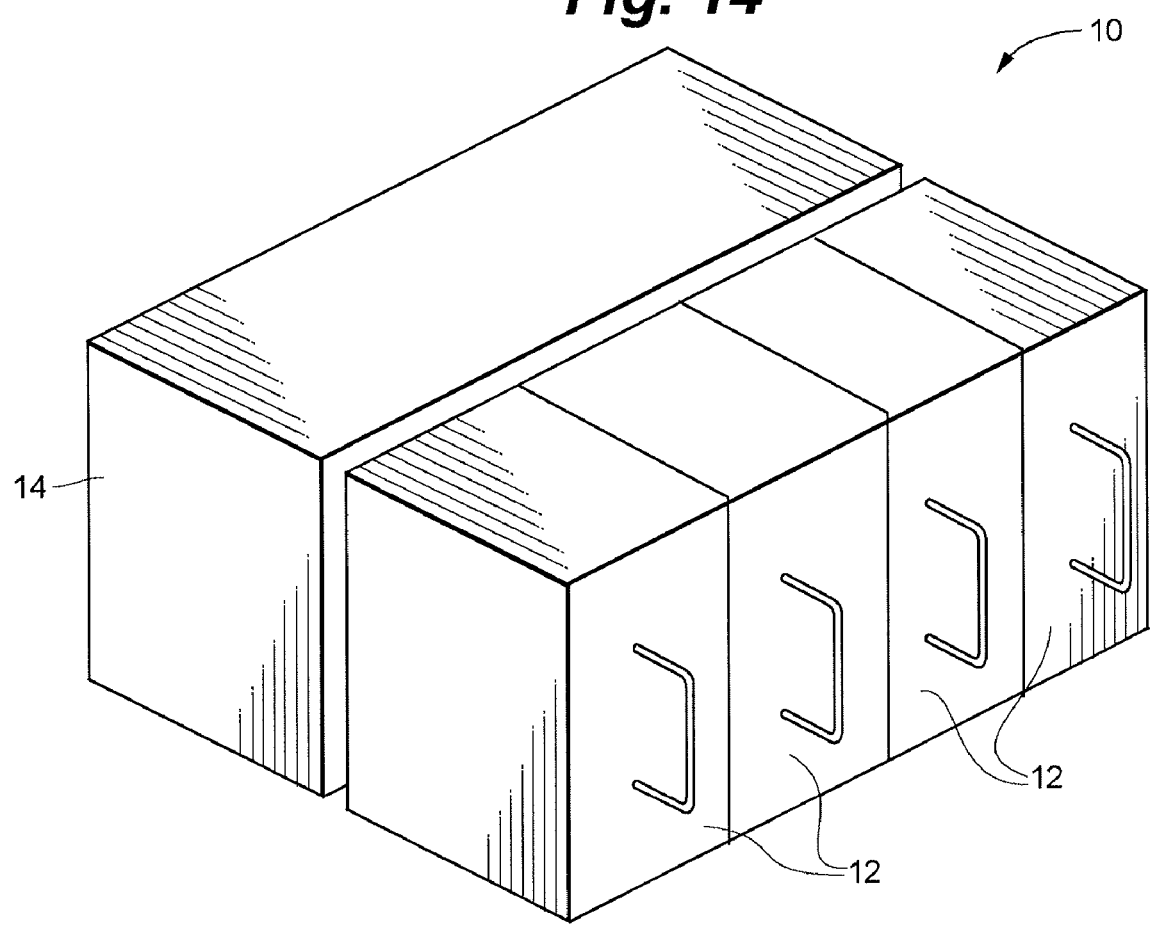
FIG. 14 is a perspective view of a first embodiment of the SCS structure with four SCUs attached to the SPIU.

FIG. 14 is a perspective view of one embodiment of the SCS 10 structure, depicting a plurality of enclosed SCUs 12 connected to SPIU 14. In general, the MGV supplies fluid and electrical connections to the SPIU 14. Blind mate electrical and fluid disconnects are mounted between the SPIU 14 and the SCU 12 unit to connect the previously described electrical components and thermal management systems. In this embodiment, four SCUs 12 are mounted to a single SPIU 14.

Figure 15:
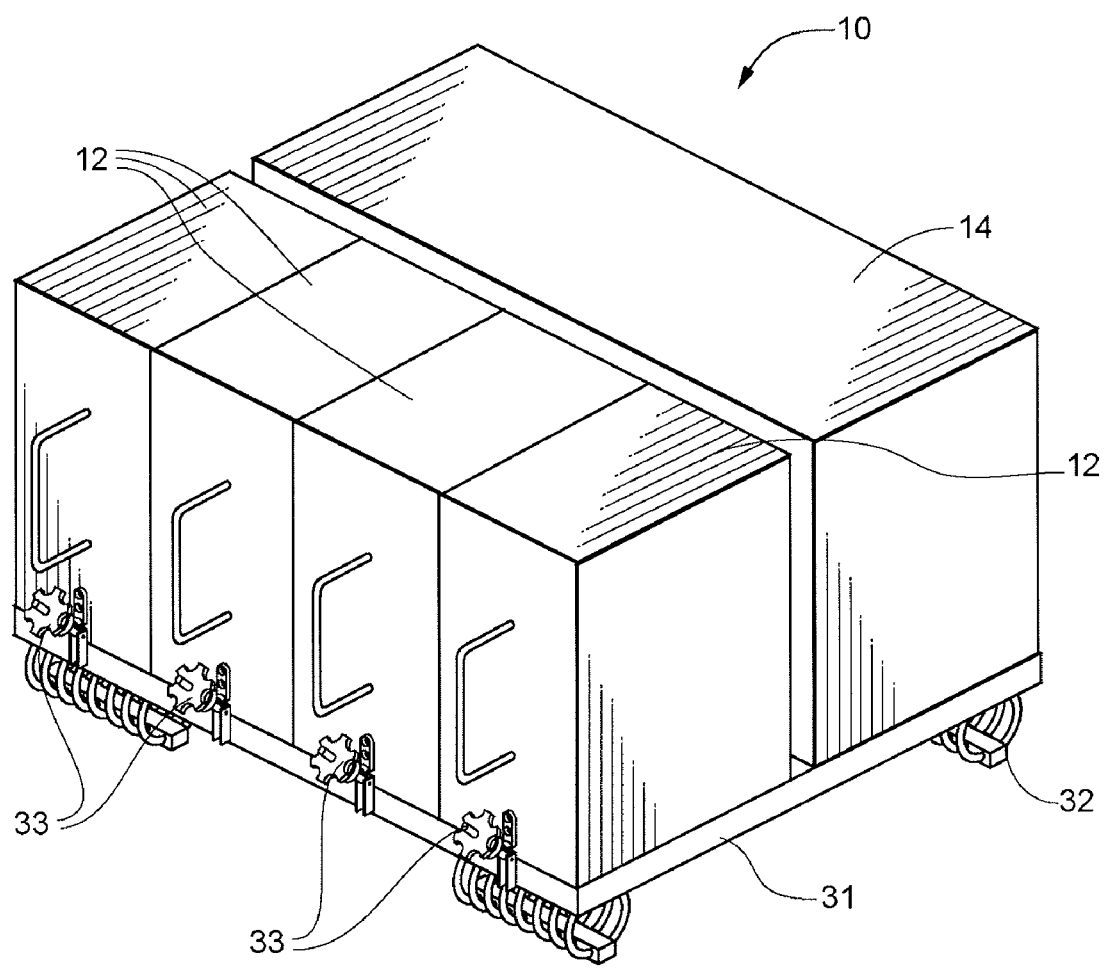
FIG. 15 is a perspective view of the SCS Vehicle Integration system.

FIG. 15 is a perspective view of the SCS 10. In the embodiment presented, the SCS 10 is disposed on a rack 31, which is hard-mounted to the MGV. A variety of isolators 32 for the SCS can be envisioned but this embodiment illustrates the placement of wire rope isolators. At the front of each SCU 12 unit is a positive self locking equipment fastener 33 that prompts the SCU 12 to the SPIU 14.

Figure 16:
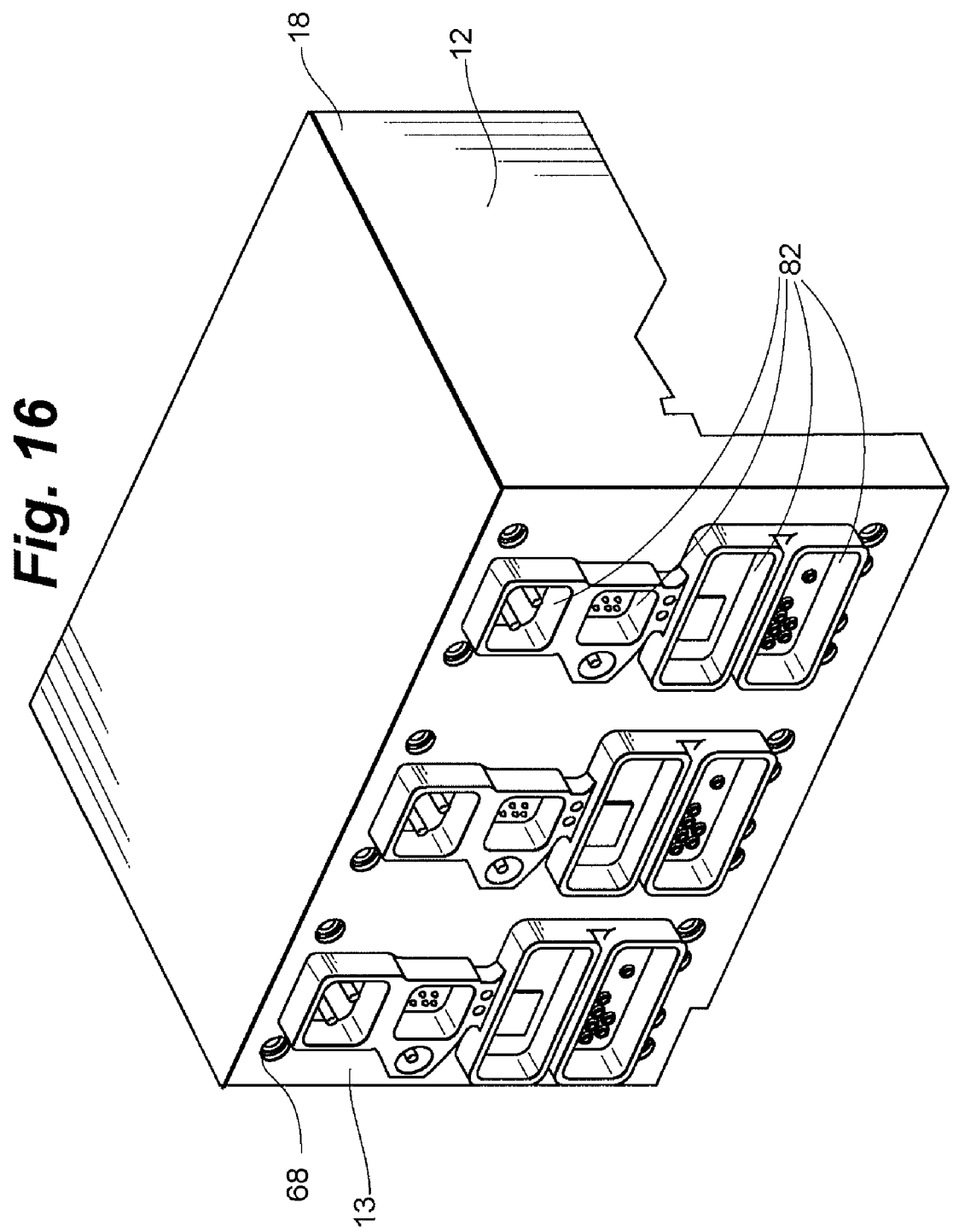
FIG. 16 is a front perspective view of an alternate embodiment of the SPIU in which the connector panel is accessed from two sides.
Figure 17:
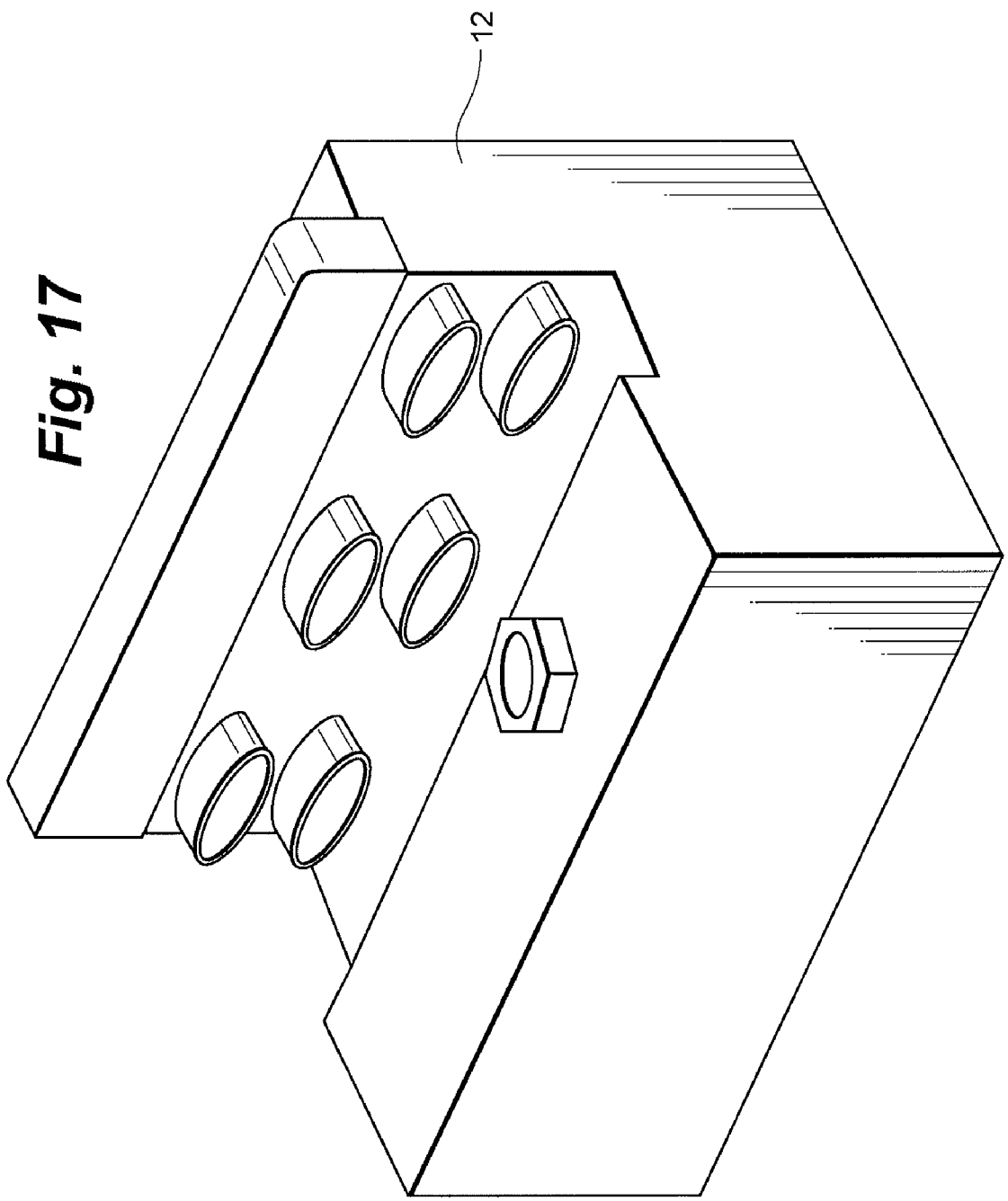
FIG. 17 is a rear perspective view of an alternate embodiment of the SPIU in which the connector panel is accessed from two sides.

FIGS. 16 and 17 illustrate opposing views of an alternate embodiment of the HAMPs 18 of SCU 12 with a three-channel alternate embodiment of connector plate 13. In this embodiment, each channel of connector plate 13 includes electrical connectors 82 and fluid connectors 68. Connector plate 13 extends below the SCU 12 case. The novel shape of connector plate 13 allows for greater flexibility in design as the connector plate 13 can be accessed from the front and rear surface. This arrangement allows the user to change out one HAMP 18 type (SCU 12 type) for a different type, without affecting the SPIU 14 or SCU 12 design. As a result, SPIU 14 and SCU 12 commonality are increased and life-cycle costs decreased.

Figure 18:
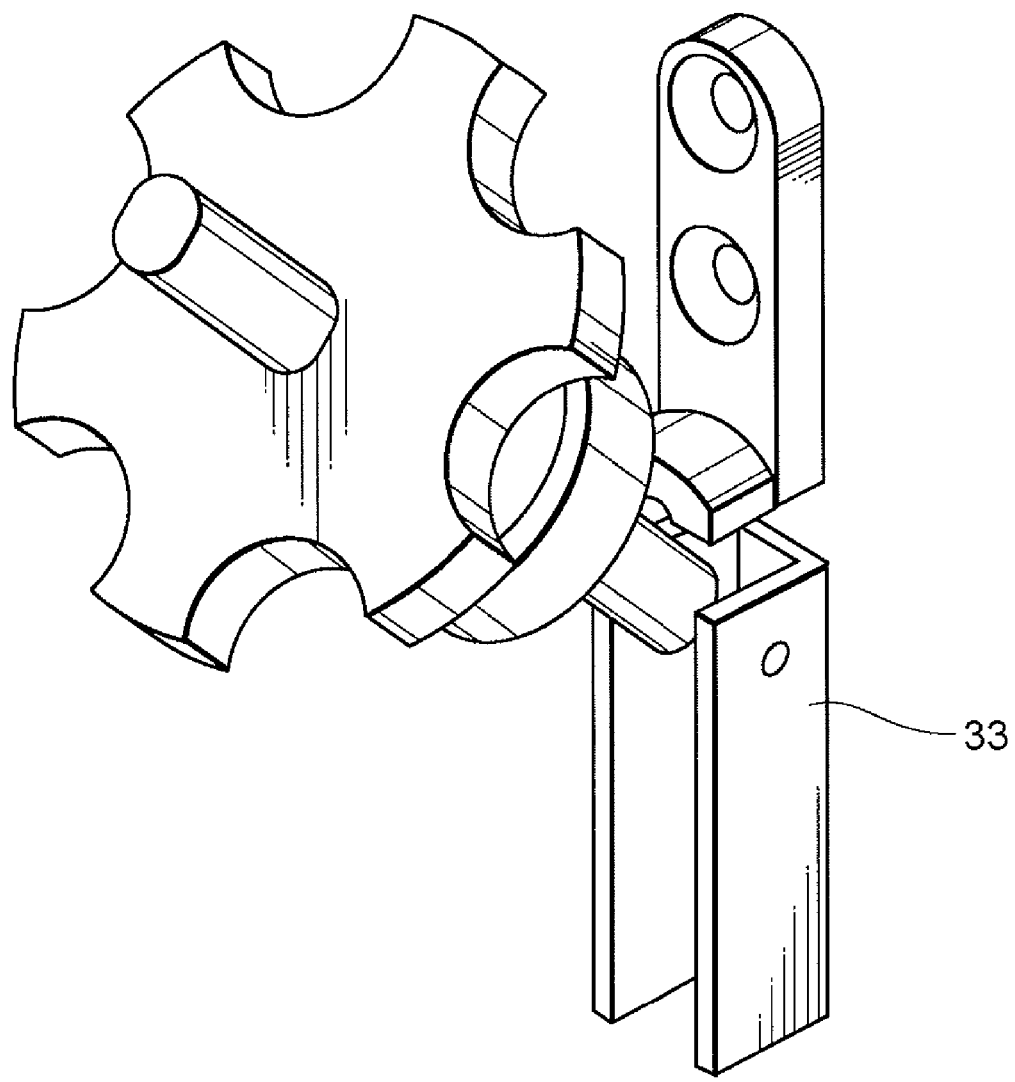
FIG. 18 is a perspective view of the self locking SCU fastener.

FIG. 18 is a perspective view of the self locking SCU fastener 33. The self locking fastener 33 is comprised of a knob that upon rotation drives the SCU 12 towards the SPIU 14. The knob support is mounted to the hard mount for the SCS 12.

Figure 19:
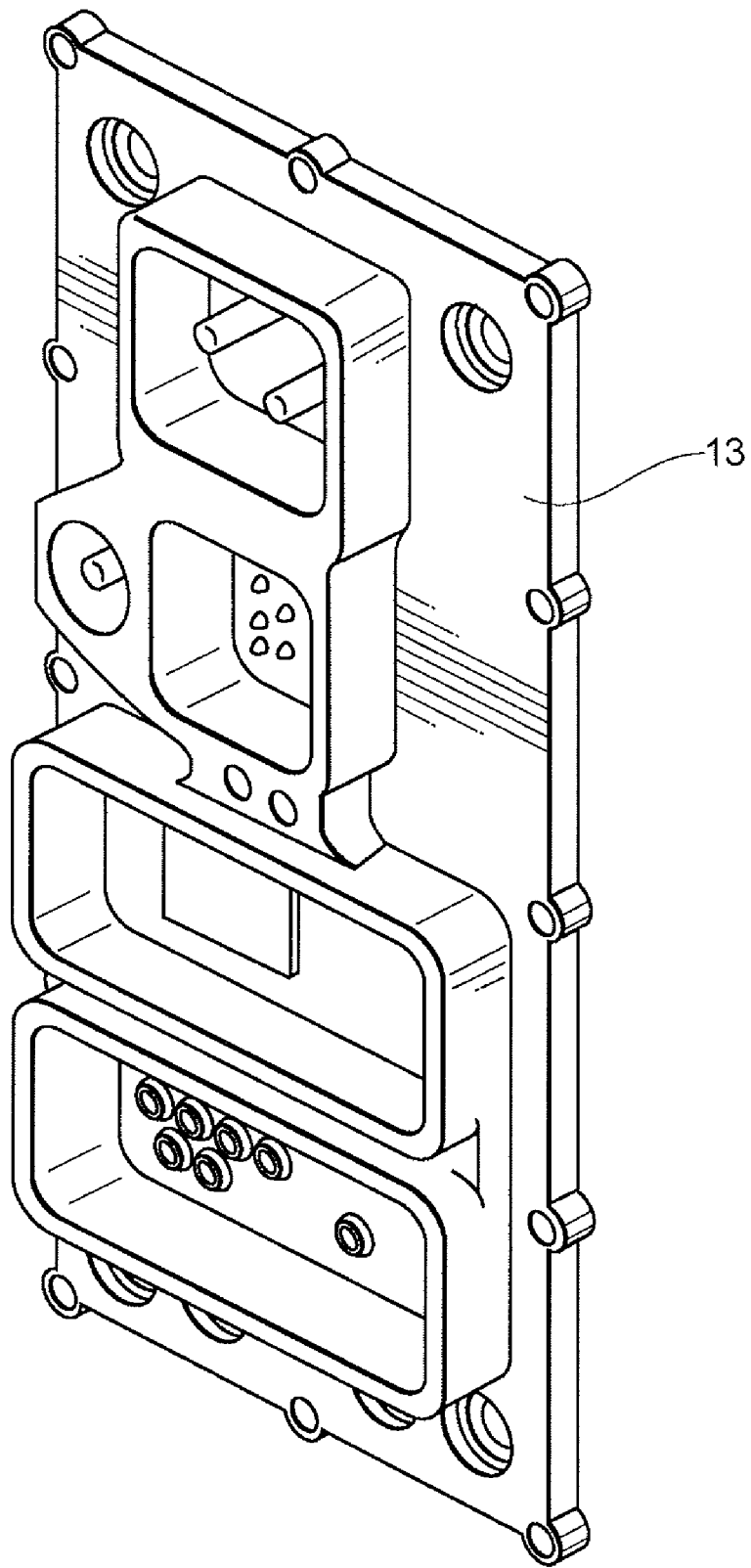
FIG. 19 is a perspective view of the SCU connector plate.

FIG. 19 is a perspective view of one embodiment of the SCU connector plate 13. In general, the lower reliability components are placed in the SCU 12 for ease of repair and replacement as the SCU 12 is easier to remove. Ideally, all shock and vibration are transmitted through the outer metallic case of the SCU unit.

Figure 20:
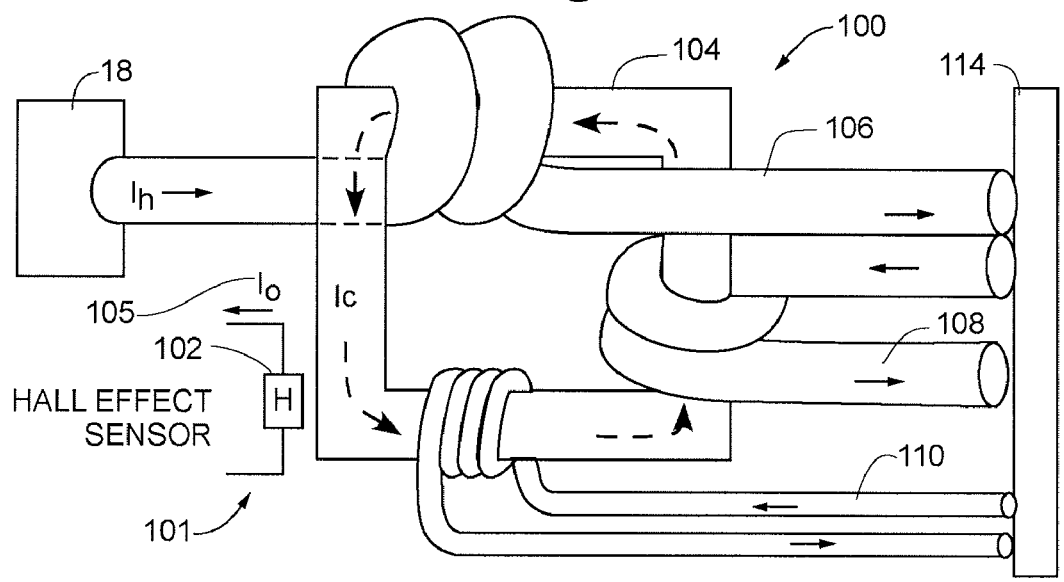
FIG. 20 is a perspective view of the transducer windings.

Most embodiments of the SCS 10 include a current sensing 100 system such as the one depicted in FIG. 20. In one embodiment, the current sensing system 100 includes transducer 101, wires 106, 108, and 110, and connector plate 114. Transducer 101 includes a Hall effect sensor 102, magnetic transducer core 104, and output current 105. Magnetic core 104 may be toroidally shaped with a center, and may be comprised of iron. In one embodiment, core 104 and Hall effect sensor 102 may be combined into a single commercially available transducer, such as a LC1000-S, that produces output current Io. In other embodiments, core 104 and Hall effect sensor 102 may be separately packaged.

Figure 21:
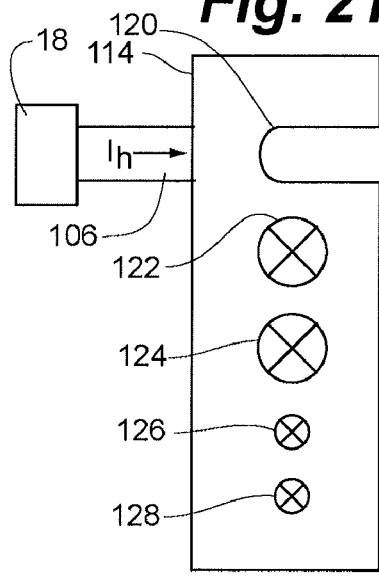
FIG. 21 is a connection plate view for a 40/80 motor.

In one embodiment, wire 106 is a primary motor wire, wire 110 is a secondary motor wire, and wire 108 may be either a primary or secondary motor wire. Wire 106 is connected at one end to connection plate 114 at connection point 120, and to a HAMP 18, or possibly another power source, at the other end. The connection may be direct or indirect through another connector. Wire 106 passes through the center of core 104 and may be wrapped around the core 104 any number of turns. In the embodiment depicted in FIG. 20, wire 106 is wrapped two times around the core 104, or has two "turns". Current Ih may flow through wire 106. Wires 108 and 110 both wrap around the core 104, and both ends of each wire 108 and 110 are connected to connection plate 114 at connection points 122 to 128 as depicted in FIGS. 20 and 21. Connection points 120 to 128 on connection plate 114 may include any number of known wire connectors.

In operation, any current flowing through the wires wound around the core 104 will induce a current Ic in the core 104, which will be detected by the Hall Effect sensor 102. Transducer 101 produces an output current Io that is a function of the current induced in the core, Ic. Usually, the output current Io is a fraction of the induced current Ic. The LC1000-S embodiment of transducer 100 is a divide by 1000 device, meaning that the output current Io is divided by 1000. Each turn of a wire around the core 104 acts as a multiplier for the induced current Ic. For example, if the induced current Ic is 1 mA with 1 turn of wire 106, it will be 4 mA with 4 turns of wire 106. Output current Io is received by a control device or system such as DCS 16 for motor control and monitoring purposes. The resolution and sensitivity of current sensing system 100 is improved by increasing the number of wire turns.

In the embodiment depicted in FIG. 20, the current sensing system 100 includes two eight gauge wires, 106 and 108, with two turns each, and a single twelve gauge wire 110 with four turns. Connection plate 114 includes five corresponding connection points, 120 to 128 to accommodate the five wire ends. In other embodiments, the current sensing system 100 may include more or fewer wires of larger or smaller diameters, or gauges. The number of wire turns around the core 104 may also vary, as will the number of connection points on connection plate 114.

However, despite the large number of embodiments of current sensing system 100 available for use in SCS 10, any single embodiment may serve multiple motor sizes and HAMPs 18 or varying outputs.

Figure 24:
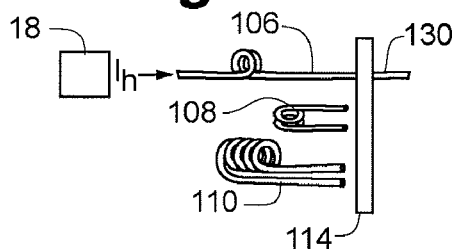
FIG. 24 is a side view of the connection plate wiring for FIG. 21.

For example, current sensing system 100 as depicted in FIG. 20 may use a wiring configuration as depicted in FIG. 21 and FIG. 24. In this embodiment, wire 106 is connected to a wire 130 through connection plate 114. Wire 130 feeds current Ih to the primary winding of a motor such as motor 22 or 23. Any current Ih flowing through wires 106 and 130 will be sensed by current sensing system 100, producing an output current Io that reflects the actual current flowing to through wire 106. In this embodiment, though wires 108 and 110 are connected to connection plate 114, no motor wires are connected to connection plate 114 at connection points 122 to 128, so wires 108 and 110 are not used. In this embodiment, the sensitivity of current sensor 100 may not be critical, and the motor may only have a primary wire, and no secondary wires.

Figure 22:
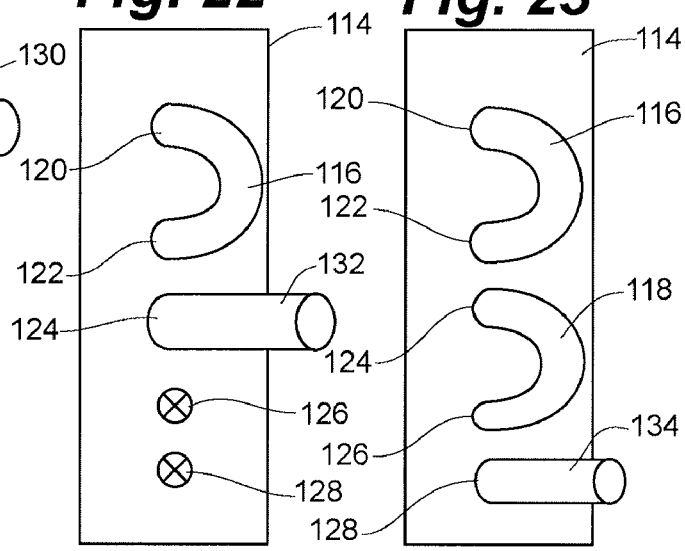
FIG. 22 is a connection plate view for a 20/40 motor.
Figure 25:
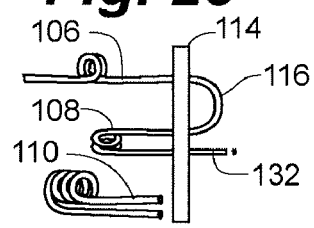
FIG. 25 is a side view of the connection plate wiring for FIG. 22.

Referring to FIG. 22 and FIG. 25, the sensitivity of current sensing system 100 is improved by connecting wires 106 and 108 at splice 116. With this splice, wire 106 becomes electrically connected in series with wire 108, resulting in a four turn configuration. The output current Io of this embodiment is doubled due to the doubling of turns, as compared to the embodiment of FIG. 21 and FIG. 24. Wire 132 feeds current Ih to the primary winding of a motor such as motor 22 or 23. In this configuration, wire 110 and connection points 126 and 128 remain unused, though in some configurations, the secondary winding of a motor 22 or 23 may be connected to wire 110 at connection points 126 and 128 to measure additional current flowing to a motor.

Figure 23:
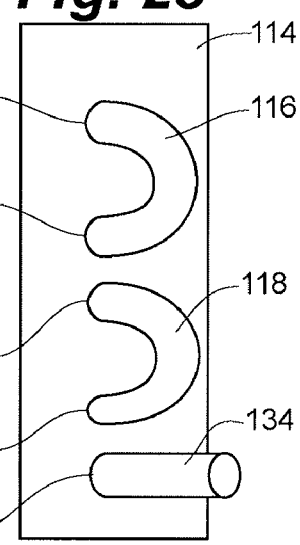
FIG. 23 is a connection plate view for a 10/20 motor.
Figure 26:
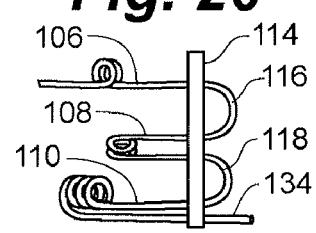
FIG. 26 is a side view of the connection plate wiring for FIG. 23.

Referring to FIG. 23 and FIG. 26, the sensitivity of current sensing system 100 is further improved as compared to previous embodiments by adding a second splice 118. With the addition of splice 118 in addition to splice 116, wires 106, 108, and 110 are electrically connected in series, and the number of turns about core 104 is increased to eight. As before, this increases output current Io, increasing sensitivity and accuracy of current sensing system 100. However, in this embodiment, despite the increased sensitivity, the overall current-carrying capability of this embodiment of current sensing system 100 is decreased as compared to previously described embodiments. In this embodiment, current Ih from HAMP 18 to motor 22 or 23 flows through series-connected wire 110 which is a smaller diameter wire than either wires 106 or 108.

As the embodiments of FIGS. 21 to 23 illustrate, simple wire splices may be added to a common current sensing system 100 to accommodate the power and control characteristics of a particular motor or HAMP 18 combination. By doing so, a single current sensing system 100 may be used with a variety of SCUs 12, SPIUs 14, HAMPs 18 and motors 22 and 23, with only minor modifications.

Figure 27:
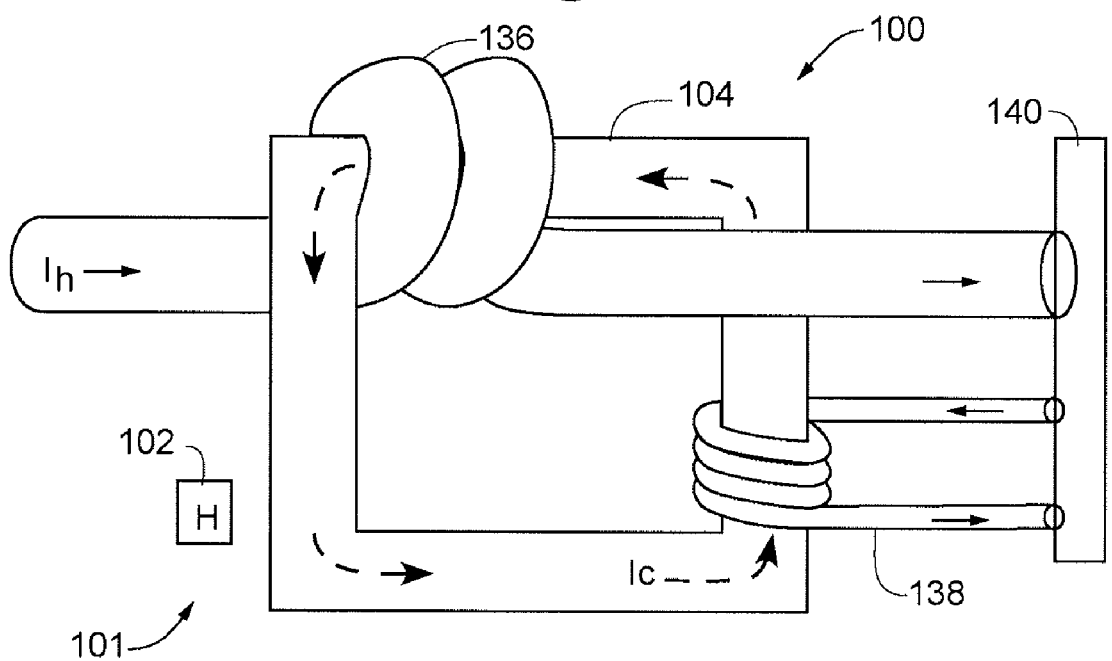
FIG. 27 is a perspective view of an alternate embodiment of the transducer windings.

In yet another embodiment of current sensing system 100, it is possible to vary the number of wires that are wound around the core. FIG. 27 has only two wires, wires 136 and 138, as compared to previous embodiments which included three wires. In this embodiment, a connection plate 140 includes only three connection points, 142, 144, and 146. In this embodiment, current sensing system 100 could serve a higher amperage motor 22 or 23 with the embodiment shown in FIG. 28, with current flowing through single larger diameter wires 136 and 143 in a two turn configuration.

Figure 29:
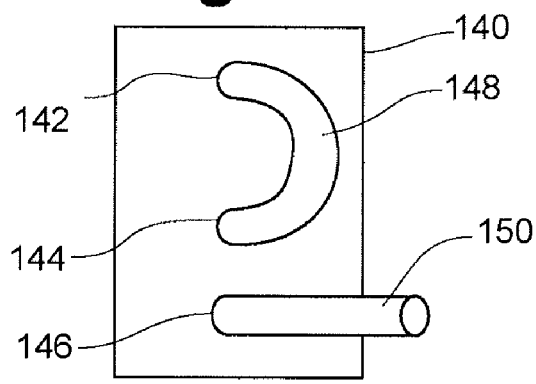
FIG. 29 is an endplate view of an alternate embodiment for a 10/20 motor.

Alternatively, if current Ih does not exceed the current-carrying capabilities of wire 138, the embodiment of FIG. 29 could be used. Splice 148 connects larger wire gauge 136 and smaller wire gauge 138 in series through connection plate 140, increasing the sensitivity of current sensing system 100. In another embodiment, the primary wire of a motor 22 or 23 may be connected to wire 136, while the secondary wire is connected to wire 138 (embodiment not depicted).

The open center portion of magnetic core 104 and the wire gauge dictates how many wires may be wound about core 104. The area of this open area limits the size and number of turns of the wires. For example, in FIG. 20, the percentage of the center core's open area is approximately 50%, while in FIG. 30, the percentage is approximately 35%. A higher "fill percentage" is more difficult to construct, since each additional turn reduces the available space for the next turn. Of course, thicker wire fills the space faster with each turn than does a thinner wire. Further, the geometry of the core 104 of the transducer 101 can impact the fill percentage. While the core is drawn as square, it could be of nearly any shape, including circular, oval, or rectangular.

Figure 28:
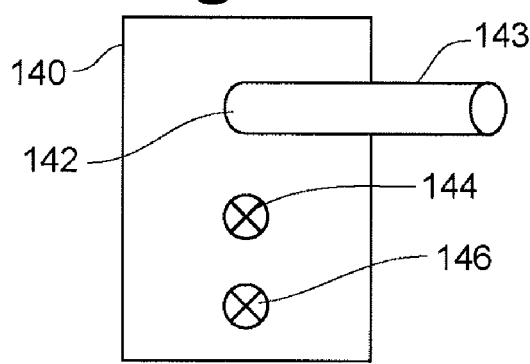
FIG. 28 is an endplate view of an alternate embodiment for a 20/40 motor.

Therefore, the various configuration of the embodiment of current sensing system 100 as depicted in FIGS. 27 to 29 is capable of serving a variety of HAMPs 18 and motors 22 and 23.

Figure 30:
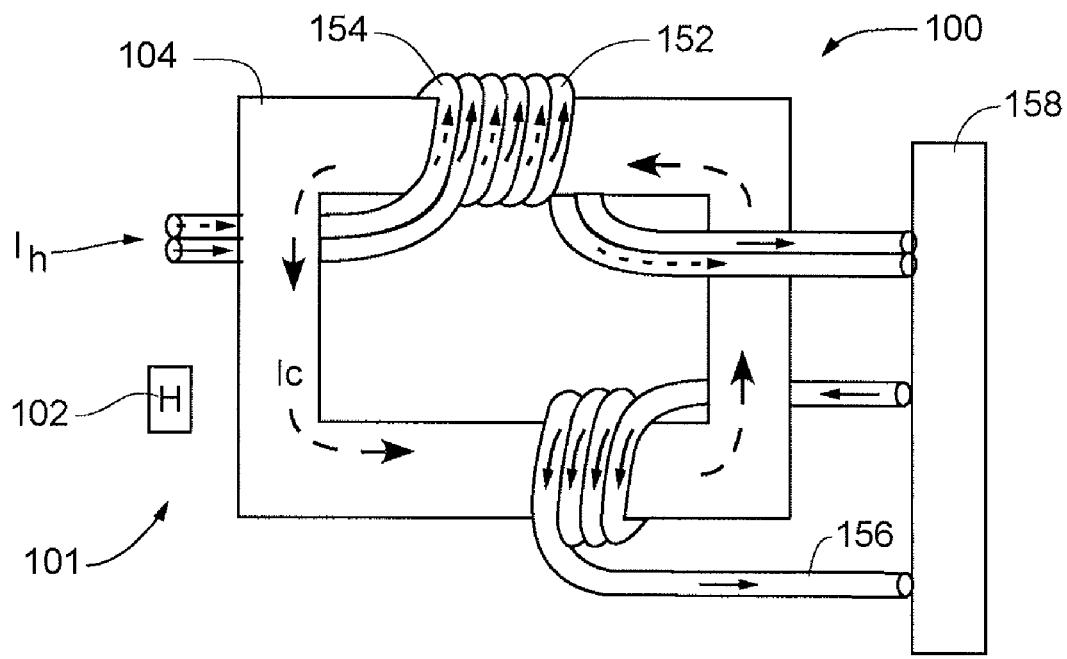
FIG. 30 is a perspective view of an alternate embodiment of the transducer windings.
Figure 31:
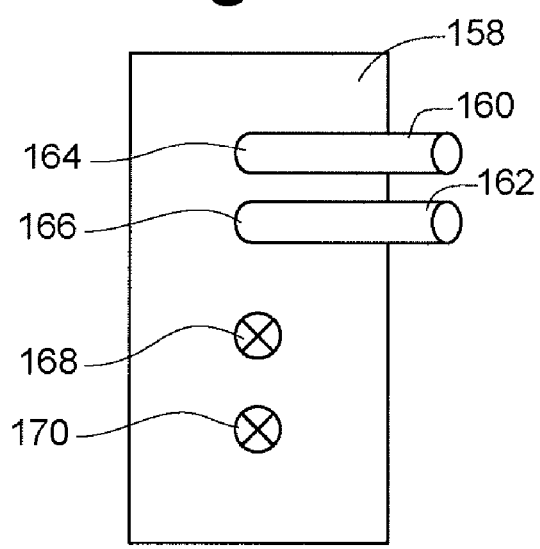
FIG. 31 is a connection plate view of an alternate embodiment for a 10/20 motor.
Figure 32:
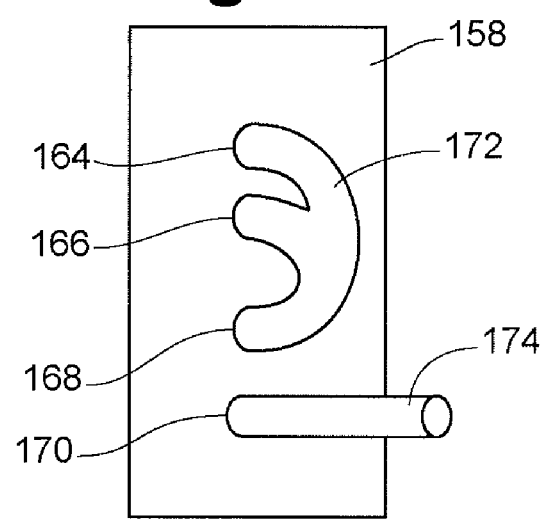
FIG. 32 is a connection plate view of an alternate embodiment for a 20/40 motor.

Referring to FIG. 30, in yet another embodiment of current sensing system 100, the primary wire wound around the transducer core 104 does not necessarily need to be a single wire. Instead, the primary wire can be multiple wires. In one embodiment, a 3-phase motor uses 2 wires for each phase. Thus, the current for each phase passes through both wires. As such, both wires need to be sensed. The embodiment of current sensing system 100 as depicted in FIG. 30 and FIG. 31 shows two wires, wires 152 and 154, serving as the primary wires. Likewise, the secondary wires can be multiple wires run in parallel, such as wire 156 and possibly another wire (not shown). Of course, any splices would need to take in account the number of wires in the primary and secondary sets, as shown in FIG. 32.

Figure 33:
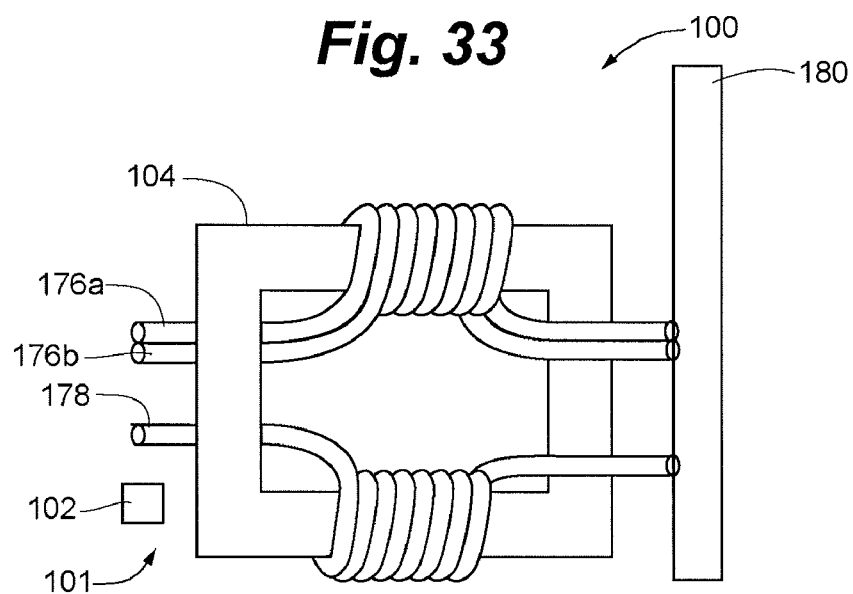
FIG. 33 is a perspective view of an another alternate embodiment of the transducer windings.

However, the use of splices may not be practical in some applications. Another embodiment of current sensing system 100 allows for current sensing for each phase with or without the need to use splices. In FIG. 33, two distinct primary wire sets are provided, wire set 176 and wire 178. Each wire could be of a different gauge wire to allow the user to match the motor's current needs to the supply. Further, each primary wire 176 and 178 could have a different number of turns, depending on the desired current measuring sensitivity and resolution. Of course, it is possible to have each primary wire be identical in wire gauge and number of turns, so as to provide the user with a redundant transducer should one fail. Further, the primary wires do not need to be limited to a single wire. For example, in FIG. 33, the primary set 176 is shown as a pair of wires 176a and 176b with 4 turns each and the secondary wire 178 is a single wire with 8 turns.

Figure 34:
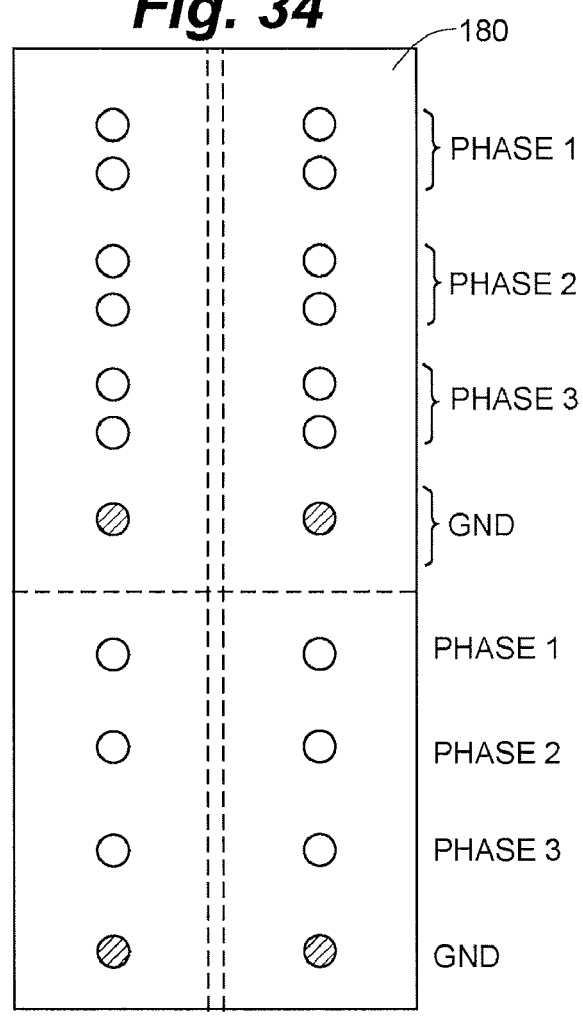
FIG. 34 is a connection plate view of an alternate embodiment for dual motors.
Figure 36:
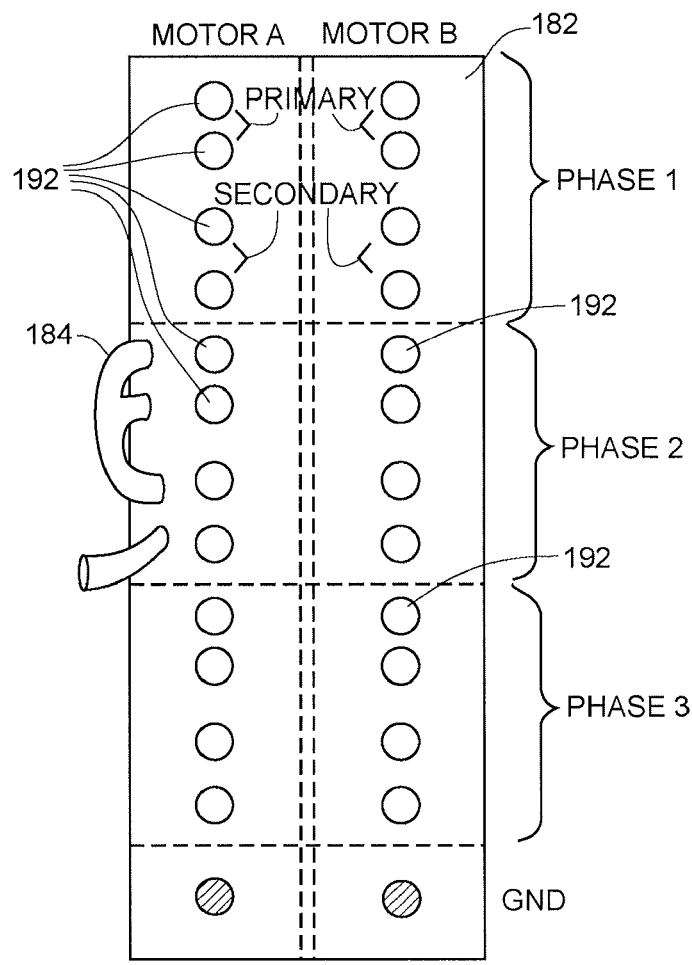
FIG. 36 is a connection plate view of an alternate embodiment for dual motors.

In the embodiment depicted in FIG. 34, to help a user be consistent with which set of primary wires is to be connected, a connection plate 180 can group each set of primary wires for a single motor 22 or 23 together. For example, in FIG. 36, the left half of connection plate 182 is dedicated to a first motor (not shown) while the right half is dedicated to a second motor (not shown). The connection plate 182 has the primary wires for each phase (with two wires per phase) grouped together, and the secondary wires are likewise grouped. The connection plate 180 may also provide a ground or chassis wire connection as depicted at the bottom of each quadrant of connection plate 180. It is also possible to have only one primary wire or more than two sets of primary wires. The fill percentage and the density of the connectors in the end plate would dictate just how many sets of primary wires are possible and/or practical.

The HAMP connection plate 180 of FIG. 34 allows the user to connect two separate 3-phase motors to the same plate. The Top Section provides a set of dual-wire connections (for the upper 2 wires) for each phase. The Lower Section provides a single wire connection for the lower wires for each phase. Both the Top and Lower sections of the end connector plate can also have a single ground or chassis wire connection.

However, the fill percentage can be quite high in this embodiment. An embodiment as shown in FIGS. 33 and 34 with 12 gauge wire has a fill percentage of approximately 74%, which can be very difficult to construct.

Figure 35:
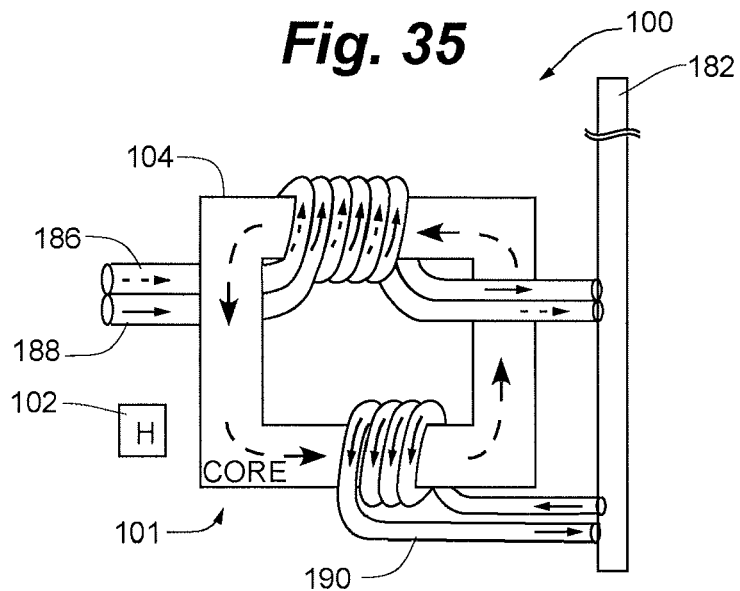
FIG. 35 is a perspective view of an another alternate embodiment of the transducer windings.

Another embodiment provides for a combination of the transducer embodiment of FIG. 20 and the HAMP connection plate 180 of FIG. 34, wherein the use of splices, as exemplified by splice 184, provides the ability to connect HAMPs 18 of differing current requirements or change the current measuring sensitivity and resolution. As shown in FIG. 35, the transducer has two primary wires 186 and 188, and a secondary wire 190. A splice would allow the user to connect the primary wires 186 and 188 and the secondary wire 190 in series with each other. In this case, the fill percentage is approximately 55%. Further, the HAMP connection plate 182 of FIG. 36 has the connector points 192 positioned to make the splices between the upper wires and the lower wires more convenient.

With respect to three-phase motors connected to current sensing system 100, phase 1 and phase 2 are both measured. Although phase 3 could be measured it would be unnecessary since all three phases must sum to be zero. Measuring and adding phases 1 and 2 would allow the user to calculate phase 3. As such, a transducer 101 for phase 3 is unneeded. However, having a transducer on all three phases would allow a user to run diagnostic checks on the system by confirming that the transducer 101 currents always sum to zero; if they do not, then the user will know that at least one transducer 101 has failed.

As such, the present invention therefore addresses and resolves many of the deficiencies and drawbacks previously identified. The invention may be embodied in other specific forms without departing from the essential attributes thereof; therefore, the illustrated embodiments should be considered in all respects as illustrative and not restrictive. For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A modular current sensing system for a servo control system comprising:
   a magnetic core defining an open center portion;
   a connection plate including at least three wire connectors, including a first, a second, and a third wire connector, wherein each wire connector is capable of connecting at least two wires electrically in series and the first wire connector is electrically connected to a primary winding of a first motor;
   a plurality of wires, including: a first wire with a first end and a second end, wherein the first end of the first wire is electrically connected to a first power source, and the second end of the first wire is connected to the connection plate at the first wire connector and wherein the first wire passes through the open portion defined by the magnetic core at least once, the first wire thereby inducing a core current to flow in the magnetic core and causing the magnetic core to emit a magnetic field upon initiation of a first motor current flowing between the power source and the primary winding of the first motor; a second wire with a first end connected to the second wire connector and a second end connected to the third wire connector, and wherein the second wire passes through the open portion defined by the magnetic core at least once;
   a Hall effect sensor that detects the magnetic field, produces an output current, and delivers the output current to a control device within a servo control system; and
   wherein the first and second connectors are adapted to receive a splicing device to electrically connect the first and second connectors and cause the first and second wires when spliced to become one effective wire that wraps around the core in multiple places to produce multiple magnetic fields.

2. The current sensing system of claim 1 wherein the second wire is electrically connected to the secondary winding of the first motor.

3. The current sensing system of claim 1 wherein at least one of the wire connectors is connected only to one of the plurality of wires.

4. The current sensing system of claim 1 further including the splicing device electrically connecting the first wire connector and the second wire connector.

5. The current sensing system of claim 1, wherein at least one of the second wire connector and the third wire connector is electrically connected to a winding of a second motor.

6. The current sensing system of claim 5, wherein the first motor and the second motor have different rms current ratings.

7. The current sensing system of claim 1, wherein the second motor is electrically connected to a second power source connected through one of the plurality of wires.

8. The current sensing system of claim 7, wherein the second power source is capable of supplying substantially more power than the first power source.

9. A method for sensing current flowing from a power source to a motor in a servo control system comprising:
   generating a primary current in the power source;
   conducting the primary current through a first primary wire;
   winding the first primary wire about a magnetic core, inducing a first core current and a first magnetic core;
   connecting and a first primary wire to a connection plate;
   conducting the primary current through the connection plate, through a splice device, back through the connection plate, and into a second primary wire;
   winding the second primary wire around the core, inducing a second core current in the magnetic core and a second magnetic field;
   sensing the and second magnetic fields with a Hall effect sensor and generating an output current proportional to the sum of all core currents; and
   sending the output current to a control device in a servo control system.

10. The current sensing method of claim 9, further comprising
   generating a secondary current in the power source;
   conducting the secondary current through a first secondary wire;
   connecting a first end of the first secondary wire to the connection plate;
   winding the first secondary wire about a magnetic core, inducing a third core current and a third magnetic field in the magnetic core;
   connecting a second end of the first secondary wire to the connection plate; and
   further sensing the third magnetic field with the Hall effect sensor.

* * * * *

UNITED STATES PATENT AND TRADEMARK OFFICE
CERTIFICATE OF CORRECTION

PATENT NO. : 7,459,900 B2  Page 1 of 1
APPLICATION NO. : 11/702445
DATED : December 2, 2008
INVENTOR(S) : Grupa et al.

It is certified that error appears in the above-identified patent and that said Letters Patent is hereby corrected as shown below:

Column 14, Line 19:
Delete "magnetic".

Column 14, Line 20:
Delete "and a" and insert --the--.

Column 14, Line 27:
"sensing the and second" should be --should the first and second--.

Signed and Sealed this

Twenty-ninth Day of June, 2010

David J. Kappos
*Director of the United States Patent and Trademark Office*